US012633235B2

(12) United States Patent
Yeon et al.

(10) Patent No.: US 12,633,235 B2
(45) Date of Patent: May 19, 2026

(54) WINDOW MEMBER, DISPLAY DEVICE, AND METHOD OF MANUFACTURING DISPLAY DEVICE

(71) Applicant: Samsung Display Co., Ltd., Yongin-si (KR)

(72) Inventors: Eun Kyung Yeon, Suwon-si (KR); Sung Hoon Kim, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 17/456,348

(22) Filed: Nov. 23, 2021

(65) Prior Publication Data

US 2022/0198965 A1     Jun. 23, 2022

(30) Foreign Application Priority Data

Dec. 23, 2020     (KR) ........................ 10-2020-0181754

(51) Int. Cl.
| | |
|---|---|
| *G09F 9/30* | (2006.01) |
| *H01L 51/56* | (2006.01) |
| *H10K 59/80* | (2023.01) |
| *H10K 71/00* | (2023.01) |
| *H10K 102/00* | (2023.01) |

(52) U.S. Cl.
CPC ........... *G09F 9/301* (2013.01); *H10K 59/871* (2023.02); *H10K 71/00* (2023.02); *H10K 2102/311* (2023.02)

(58) Field of Classification Search
CPC .... H10K 71/00; H10K 2102/311; B32B 3/30; B32B 2457/20; G09F 9/301
See application file for complete search history.

(56) References Cited

U.S. PATENT DOCUMENTS

| | | | |
|---|---|---|---|
| 2014/0029212 A1* | 1/2014 | Hwang | H05K 1/028 |
| | | | 361/749 |
| 2018/0124937 A1* | 5/2018 | Choi | G06F 1/1681 |
| 2018/0162095 A1* | 6/2018 | Lim | B32B 7/06 |

(Continued)

FOREIGN PATENT DOCUMENTS

| | | |
|---|---|---|
| CN | 209487510 U | 10/2019 |
| KR | 10-0969473 B1 | 7/2010 |

(Continued)

OTHER PUBLICATIONS

Kim, Sungil et al.; "Optimization of selective laser-induced etching (SLE) for fabrication of 3D glass microfluidic device with multi-layer micro channels"; Micro and Nano Systems Letters; (2019) 7:15, 7 pps.

(Continued)

*Primary Examiner* — Maria V Ewald
*Assistant Examiner* — Ethan Weydemeyer
(74) *Attorney, Agent, or Firm* — Womble Bond Dickinson (US) LLP

(57)     ABSTRACT

Provided are a window member, a display device and a method of manufacturing display device. The window member includes a first surface, and a second surface opposite to the first surface, and defining a groove at the first surface that is recessed toward the second surface, and that has a rounded end portion, wherein a thickness of the window member at a portion at which the groove is formed is less than a depth of the groove.

15 Claims, 18 Drawing Sheets

(56)                     References Cited

U.S. PATENT DOCUMENTS

2020/0009691 A1 *    1/2020    Ostholt ................... B41J 2/162
2020/0262746 A1 *    8/2020    He ....................... B32B 27/325

FOREIGN PATENT DOCUMENTS

KR       10-2015-0017819  A       2/2015
KR       10-2018-0068382  A       6/2018
KR       10-2019-0082339  A       7/2019
KR       10-2019-0116378  A       10/2019
WO       WO-2018162385  A1 *   9/2018    ......... B23K 26/0006
WO       WO-2019085422  A1 *   5/2019    ............ B32B 17/06

OTHER PUBLICATIONS

Office Action issued Mar. 27, 2026 by the CNIPA for corresponding
Chinese Patent Application No. 2026032702664370, 13 pages.

* cited by examiner

DM

GR: S1, S2, S3, S4, S5, PT

GRa: S1a, S2a, S3a

GRb: S1b, S2b, S3b

GRc: S1c, S2c, S3c, S4c, S5c, PT

WINDOW MEMBER, DISPLAY DEVICE, AND METHOD OF MANUFACTURING DISPLAY DEVICE

CROSS-REFERENCE TO RELATED APPLICATION

This application claims priority to, and the benefit of, Korean Patent Application No. 10-2020-0181754 filed on Dec. 23, 2020 in the Korean Intellectual Property Office, the contents of which in its entirety are herein incorporated by reference.

BACKGROUND

1. Field

The present disclosure relates to a window member, a display device, and a method of manufacturing the display device.

2. Description of the Related Art

The importance of display devices is increasing with the development of multimedia. Accordingly, various types of display devices such as an organic light-emitting display (OLED) device, a liquid crystal display (LCD) device, and the like are being used.

Recently, foldable display devices to which a flexible display panel is applied have been developed to provide a large screen when used and improve portability. Each component of the flexible display panel may be made of a flexible material and thus may be bent.

A window member applied to the flexible display panel may also have flexibility to be integrally foldable or unfoldable with the flexible display panel. To this end, a pattern for enhancing the flexibility of the window member may be formed in at least a partial area of the window member.

SUMMARY

Aspects of the present disclosure provide a window member capable of preventing damage due to concentration of stress.

Aspects of the present disclosure also provide a display device including the window member.

Aspects of the present disclosure also provide a method of manufacturing the display device.

It should be noted that objects of the present disclosure are not limited to the above-described objects, and other objects of the present disclosure will be apparent to those skilled in the art from the following descriptions.

Some embodiments of a window member includes a first surface, and a second surface opposite to the first surface, and defining a groove at the first surface that is recessed toward the second surface, and that has a rounded end portion, wherein a thickness of the window member at a portion at which the groove is formed is less than a depth of the groove.

The groove may be at least partially defined by a first inner surface having a first side connected to the first surface, and extending flatly toward the second surface, a second inner surface facing the first inner surface, having a first side connected to the first surface, and extending flatly toward the second surface, and a rounded surface connecting a second side of the first inner surface and a second side of the second inner surface, the rounded surface being concave toward the second surface.

The first inner surface and the second inner surface may be inclined such that a width of the groove becomes narrower toward the second surface.

The rounded surface may have an elliptical shape that is partially open toward the first surface in a cross-sectional view.

At least one of a length of a major axis of the elliptical shape and a length of a minor axis of the elliptical shape may be substantially equal to a width between the first side of the first inner surface and the first side of the second inner surface.

The groove may be partially defined by a pair of protrusions protruding toward an inside thereof so that a width of the groove decreases in a cross-sectional view.

The thickness of the window member at the portion at which the groove is formed may be less than or equal to about 30 μm.

Some embodiments of a display device includes a display panel, a window member on the display panel and defining a groove that is recessed from a first surface of the window member facing the display panel in a thickness direction, and that has a rounded end portion, and a filling member filled in the groove.

The groove may be at least partially defined by a first inner surface that has a first side connected to the first surface of the window member, and that extends flatly toward a second surface of the window member, the second surface being opposite to the first surface of the window member, a second inner surface that faces the first inner surface, that has a first side connected to the first surface of the window member, and that extends flatly toward the second surface of the window member, and a rounded surface that connects a second side of the first inner surface and a second side of the second inner surface, and that is concave toward the second surface of the window member.

The first inner surface and the second inner surface may be inclined such that a width of the groove becomes narrower toward the second surface.

The rounded surface may have an elliptical shape that is partially open toward the first surface of the window member in a cross-sectional view.

At least one of a length of a major axis of the elliptical shape and a length of a minor axis of the elliptical shape may be equal to a width between the first side of the first inner surface and the first side of the second inner surface.

The groove may be partially defined by a pair of protrusions protruding toward an inside thereof so that a width of the groove decreases in a cross-sectional view.

A difference of respective refractive indexes of the window member and the filling member may be about 0.0001 or less.

A second surface of the window member, which is opposite to the first surface of the window member, may be directly exposed to outside of the display device.

Some embodiments of a method of manufacturing a display device includes forming a groove recessed in a thickness direction of a window member, and having a rounded end portion, and filling the groove with a filling member having a substantially similar refractive index to the window member.

The forming of the groove may include irradiating a laser to the window member, and etching the window member.

The irradiating of the laser to the window member may include irradiating a first laser to the window member to form a first laser affected area, and irradiating a second laser having a focus that is different from that of the first laser to the window member to form a second laser affected area.

The etching of the window member may include alternately exposing the window member to a hydrofluoric acid-based etching solution and a non-hydrofluoric acid-based etching solution.

The forming of the groove may include forming a first inner surface that has a first side connected to a first surface of the window member, and that extends flatly toward a second surface of the window member, which is opposite to the first surface of the window member, forming a second inner surface that faces the first inner surface, that has one side connected to the first surface of the window member, and that extends flatly toward the second surface of the window member, and forming a rounded surface that connects a second side of the first inner surface and a second side of the second inner surface, and that is concave toward the second surface of the window member.

Other details of embodiments for solving the above problems are included in the detailed description and the drawings.

BRIEF DESCRIPTION OF THE DRAWINGS

The above and other aspects and features of the present disclosure will become more apparent by describing embodiments thereof in detail with reference to the attached drawings, in which.

DETAILED DESCRIPTION

Figure 1:
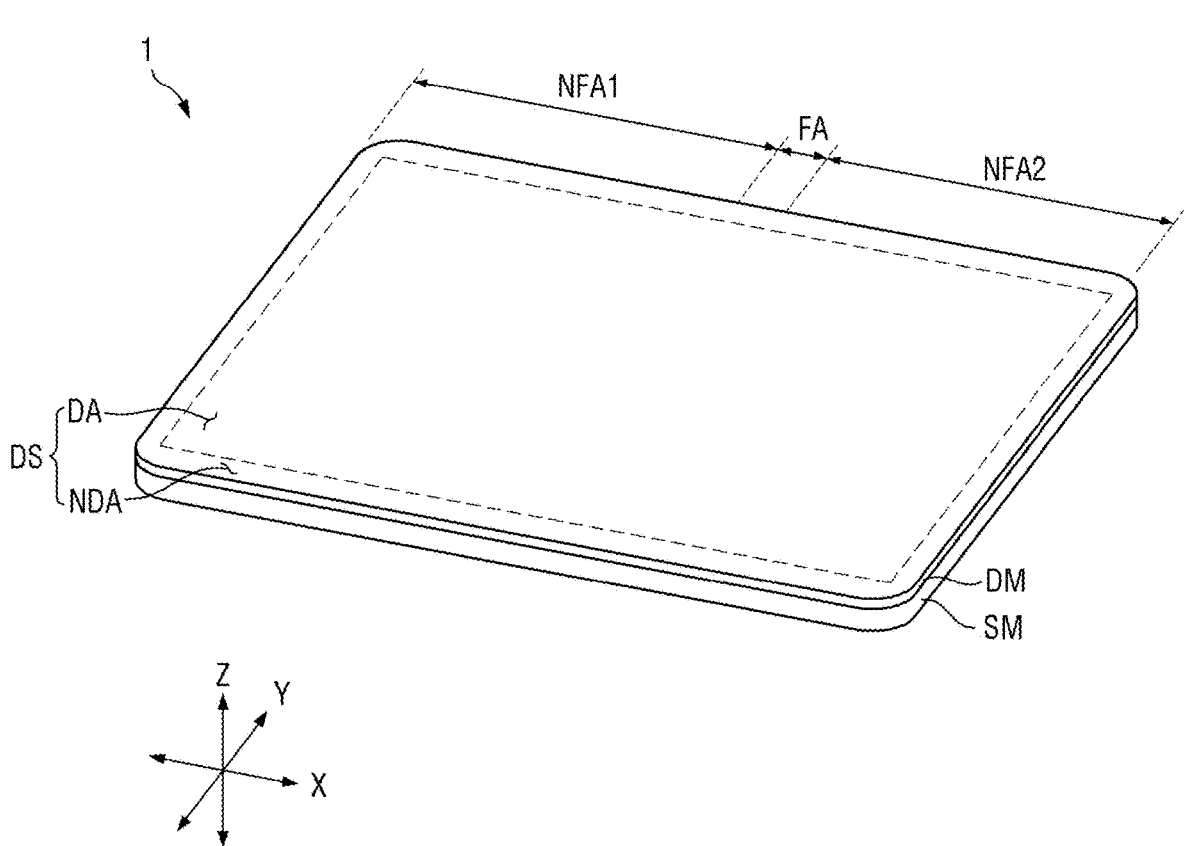
FIG. 1 is a perspective view of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
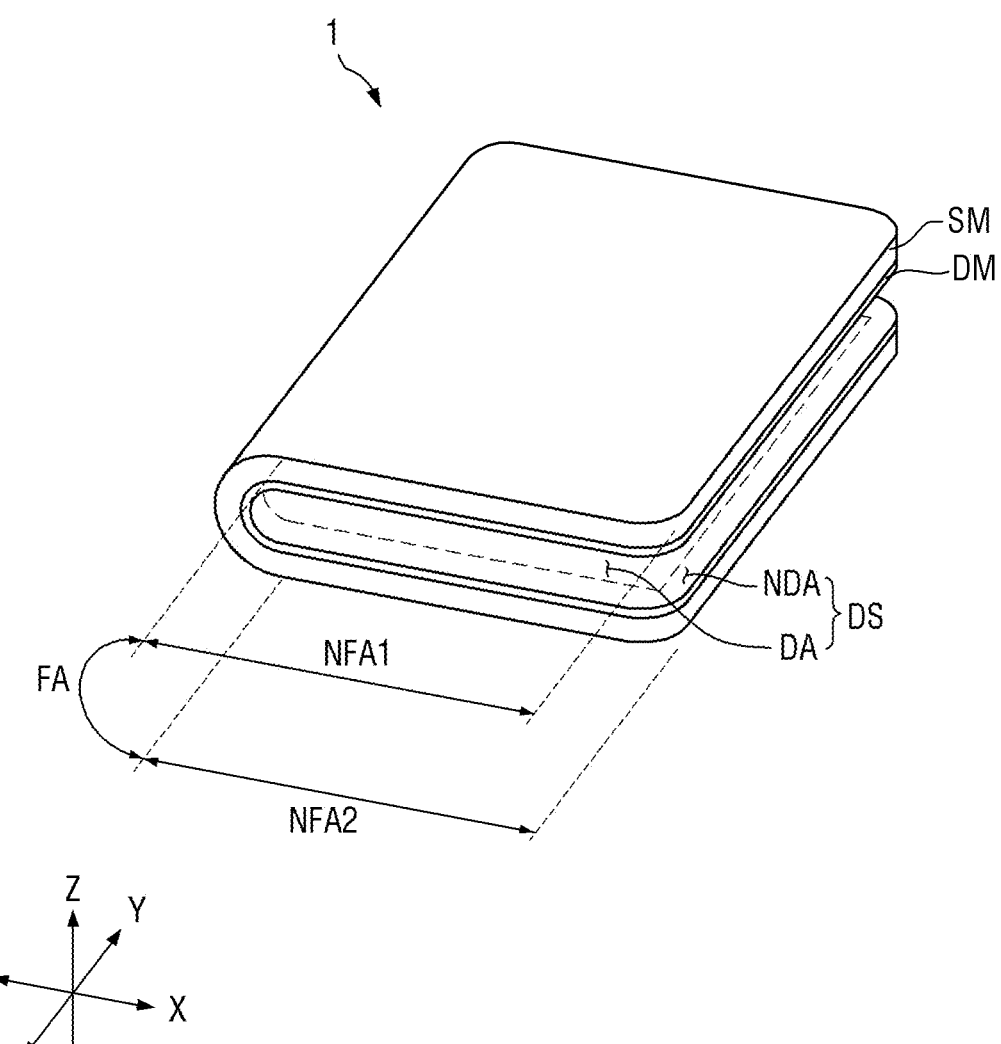
FIG. 2 is a perspective view of the display device in an in-folding state according to some embodiments.
Figure 3:
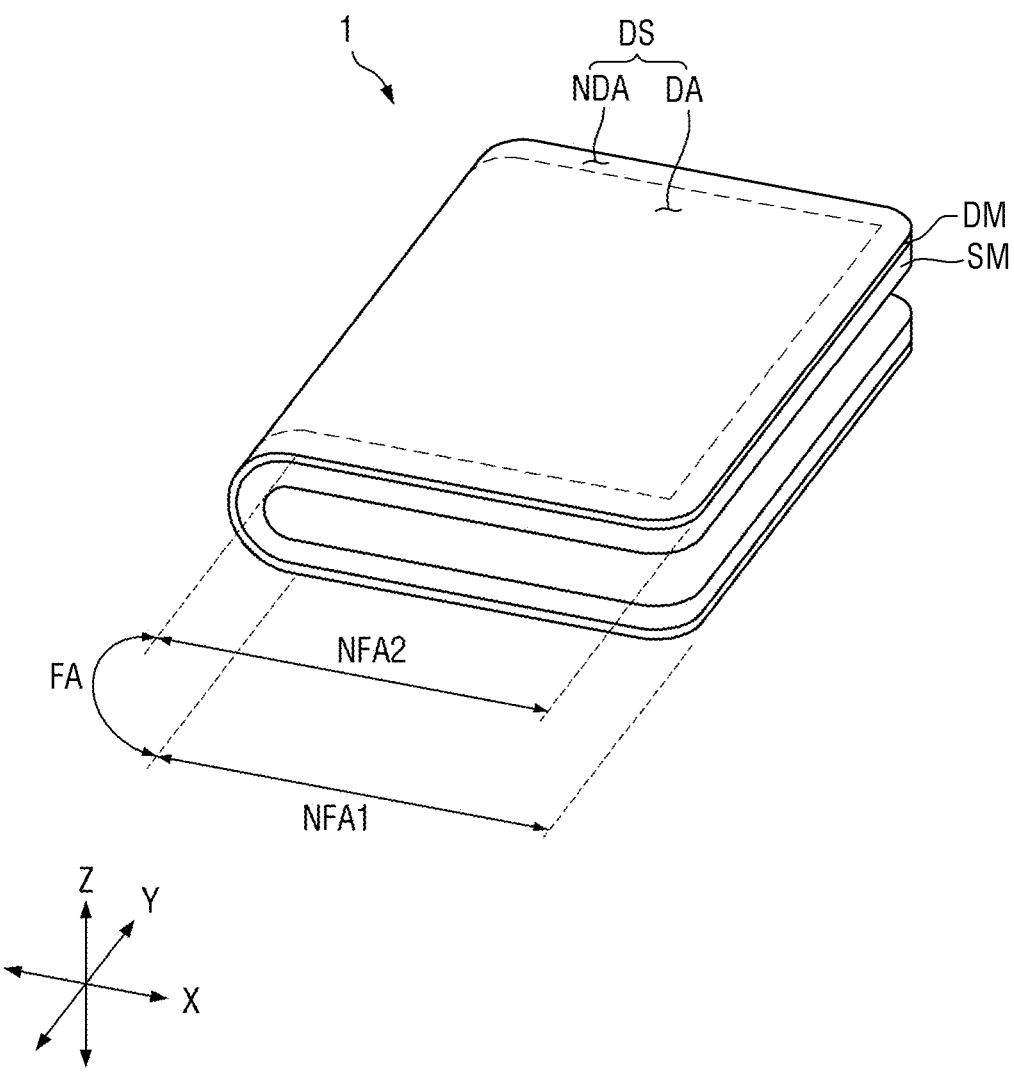
FIG. 3 is a perspective view of the display device in an out-folding state according to some embodiments.
Figure 4:
FIG. 4 is a cross-sectional view of a display module according to some embodiments.
Figure 4:
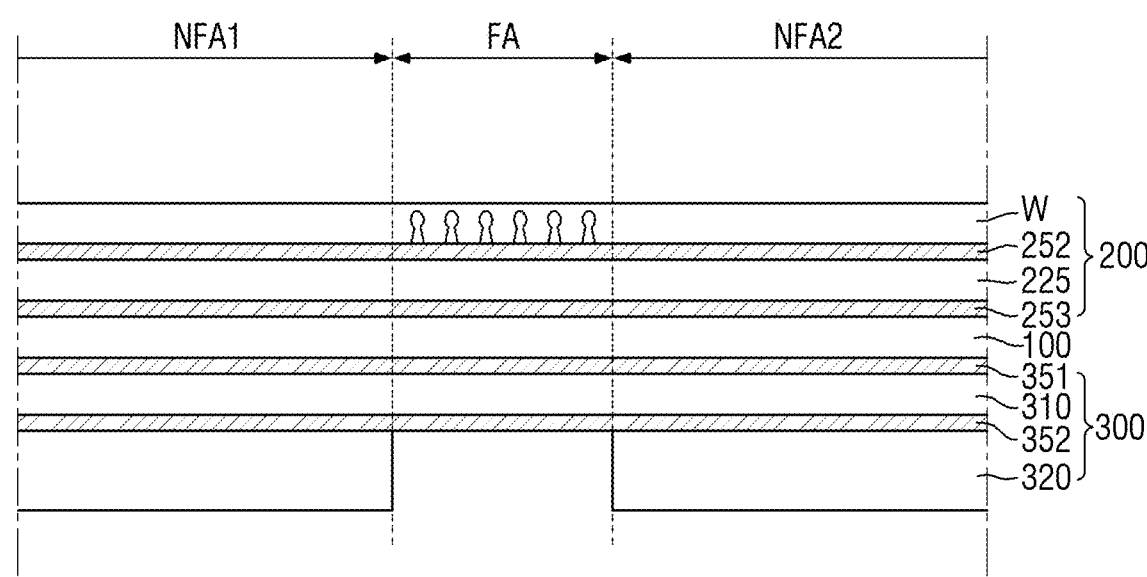
Figure 4:
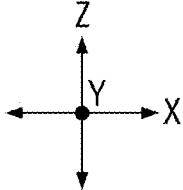
Figure 5:
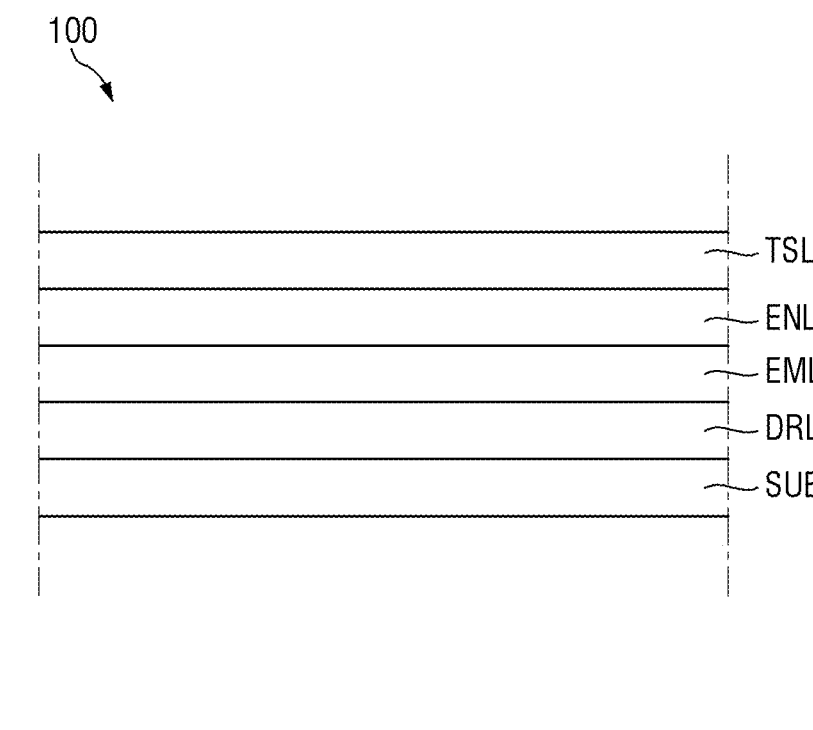
FIG. 5 is a cross-sectional view of a display panel according to some embodiments.

FIG. 1 is a perspective view of a display device according to some embodiments, FIG. 2 is a perspective view of the display device in an in-folding state according to some embodiments, FIG. 3 is a perspective view of the display device in an out-folding state according to some embodiments, FIG. 4 is a cross-sectional view of a display module according to some embodiments, and FIG. 5 is a cross-sectional view of a display panel according to some embodiments.

Hereinafter, a first direction X, a second direction Y, and a third direction Z cross each other in different directions. For example, the first direction X may be a length direction, the second direction Y may be a width direction, and the third direction Z may be a thickness direction. The first direction X, the second direction Y, and the third direction Z may each include two or more directions. For example, the third direction Z may include an upward direction toward an upper side of the drawing and a downward direction toward a lower side of the drawing. In this case, one surface (e.g., a first surface) of a member located to face in the upward direction may be referred to as an upper surface, and the other surface (e.g., a second surface) of the member located to face in the downward direction may be referred to as a lower surface. However, the above directions should be understood as referring to relative directions, and the present disclosure is not limited thereto.

A display device 1 according to some embodiments of the present disclosure may include various devices that display a video or an image. Examples of the display device 1 may include smart phones, mobile phones, tablet personal computers (PCs), personal digital assistants (PDAs), portable multimedia players (PMPs), televisions, game machines, wrist watch-type electronic devices, head-mounted displays, PC monitors, laptop computers, vehicle navigation devices, vehicle dashboards, digital cameras, camcorders, external billboards, electronic notice boards, various medical devices, various inspection devices, various home appliances such as refrigerators and washing machines, each including a display part (DPA), Internet of Things (IoT) devices, and the like, but the present disclosure is not limited thereto.

Referring to FIGS. 1 and 2, the display device 1 may have a rectangular shape in a plan view. In some embodiments, the display device 1 may have two long sides in the first direction X, and two short sides in the second direction Y crossing the first direction X in a plan view. However, the present disclosure is not limited thereto, and the display device 1 may have various shapes.

The display device 1 includes one or more display surfaces DS. In some embodiments, the display surface DS may be an upper surface of the display device 1. The display surface DS may be located to extend over a folding area FA and non-folding areas NFA1 and NFA2, which will be described below. In some embodiments, both the upper surface and a lower surface of the display device 1 may be the display surfaces DS. In some embodiments, a plurality of display surfaces DS may be two or more surfaces among the upper surface, the lower surface, and side surfaces of the display device 1.

The display surface DS may include a display area DA and a non-display area NDA.

The display area DA may display an image or a video. A plurality of pixels may be located in the display area DA.

The non-display area NDA might not display an image or a video. The non-display area NDA may be located around the display area DA. The non-display area NDA may surround the display area DA. In some embodiments, the display area DA may have a rectangular shape, and the non-display area NDA may be located at the periphery of four sides of the display area DA, but the present disclosure is not limited thereto. A black matrix may be located in the non-display area NDA to prevent light emitted from adjacent pixels from leaking.

The display device 1 may be a foldable device. At least a portion of the display device 1 may be bent so that the display device 1 is folded or unfolded. For example, a portion of the display device 1 may overlap another portion thereof, or may be bent to be inclined with respect to another portion thereof, or the entirety of the display device 1 may be unfolded flat. In some embodiments, the display device 1 may be folded so that a portion of the display device 1 has an angle greater than about 0° and less than about 180° with respect to another portion thereof, or unfolded so that the portion forms an inclination of about 180° with respect to another portion thereof.

The display device 1 may be in-folded and/or out-folded. As shown in FIG. 2, the in-folding may refer to a state in which the display device 1 is folded so that a portion of the display surface DS of the display device 1 faces another portion of the display surface DS. In addition, as shown in FIG. 3, the out-folding may refer to a state in which the display device 1 is folded so that a portion of the display surface DS does not face another portion of the display surface DS. The out-folding may also refer to a state in which the display device 1 is folded so that a portion of a surface opposite to the display surface DS faces another portion of the surface opposite to the display surface DS. In some embodiments, the display device 1 may be a bi-directional foldable device capable of both being in-foldable and out-foldable.

The display device 1 may have a folded state or an unfolded state. The folded state includes a state in which the display device 1 is bent. For example, the folded state may be a state in which the display device 1 is bent so that a portion of the display device 1 forms an inclination with respect to another portion thereof, and the unfolded state may be a state in which a portion of the display device 1 is located to be coplanar with another portion thereof. Alternatively, the folded state may be a state in which an angle between a portion of the display device 1 and another portion is greater than about 0° and less than about 180° and/or greater than about 180° and less than about 360°, and the unfolded state may be a state in which an angle between a portion of the display device 1 and another portion is about 180°. Here, the one portion and the other portion may be non-folding areas NFA1 and NFA2 to be described below, respectively.

The folded state may include at least one state of the in-folding state, as shown in FIG. 2, in which a portion of the display surface DS of the display device 1 faces another portion of the display surface DS, and the out-folding state, as shown in FIG. 3, in which a portion of a surface that is opposite to the display surface DS of the display device 1 faces another portion of the surface that is opposite to the display surface DS.

The display device 1 may be divided into the folding area FA and the non-folding areas NFA1 and NFA2. The folding area FA is an area that is folded or bent as the display device 1 is folded. The non-folding areas NFA1 and NFA2 are areas that are not folded or bent. The non-folding areas NFA1 and NFA2 may include a first non-folding area NFA1 and a second non-folding area NFA2. In some embodiments, the first non-folding area NFA1 and the second non-folding area NFA2 may be arranged in the first direction X, and the folding area FA may be located between the first non-folding area NFA1 and the second non-folding area NFA2. In some embodiments, one folding area FA and two non-folding areas NFA1 and NFA2 are defined in the display device 1, but the present disclosure is not limited thereto.

In some embodiments, a plurality of folding areas FA and a plurality of non-folding areas NFA1 and NFA2 may be defined in the display device 1. Although the first non-folding area NFA1, the second non-folding area NFA2, and the folding area FA have been described based on the entirety of the display device 1, members constituting the display device 1 may also be divided into the members in the first non-folding area NFA1, the second non-folding area NFA2, and/or the folding area FA.

The display device 1 may include a display module DM, and a support member SM supporting the display module DM. In some embodiments, the display module DM may be located to form the upper surface of the display device 1, and the support member SM may be located on a lower surface of the display module DM to support the display module DM.

At least some of the display module DM and the support member SM have flexibility. The display module DM and support member SM may be located throughout the first non-folding area NFA1, the folding area FA, and the second non-folding area NFA2.

With further reference to FIGS. 4 and 5, the display module DM may include a display panel 100, an upper stacked structure 200 located on an upper surface of the display panel 100, and a lower stacked structure 300 located on a lower surface of the display panel 100. The upper surface of the display panel 100 may be a surface on which an image or a video is displayed. In some embodiments, the display panel 100, the upper stacked structure 200, and the lower stacked structure 300 may be located throughout the first non-folding area NFA1, the folding area FA, and the second non-folding area NFA2. In some embodiments, at least one member among members constituting the upper stacked structure 200 and the lower stacked structure 300 may be separated based on the folding area FA (e.g., to be absent from the folding area).

The display panel 100 is a panel that displays a video or an image. Examples of the display panel 100 include self-luminous display panels such as an organic light-emitting diode (OLED) display panel, an inorganic electro-luminescence (EL) display panel, a quantum dot light-emitting display (QED) panel, a micro light-emitting display (micro LED) panel, a nano LED panel, a plasma display panel (PDP), a field emission display (FED) panel, and a cathode ray tube (CRT) display panel as well as light-receiving display panels such as a liquid crystal display (LCD) panel and an electrophoretic display (EPD) panel. Hereinafter, an OLED display panel is exemplified as the display panel, but the present disclosure is not limited thereto.

The display panel 100 may further include a touch member. The touch member may be provided as a panel or film separate from the display panel 100 and attached to the display panel 100, but may be provided in the form of a touch layer inside the display panel 100. In the following embodiments, a case will be described in which the touch member is provided inside the display panel 100 and included in the display panel 100, but the present disclosure is not limited thereto.

Referring to FIG. 5, the display panel 100 may include a substrate SUB, a circuit driving layer DRL located on the substrate SUB, a light-emitting layer EML located on the circuit driving layer DRL, an encapsulation layer ENL located on the light-emitting layer EML, and a touch layer TSL located on the encapsulation layer ENL.

The substrate SUB may be a flexible substrate including a flexible polymer material such as polyimide. Accordingly, the display panel 100 may be bendable, foldable, or rollable. In some embodiments, the substrate SUB may include a plurality of sub-substrates that overlap each other in the thickness direction with a barrier layer interposed therebetween. In this case, each sub-substrate may be a flexible substrate.

The circuit driving layer DRL may be located on the substrate SUB. The circuit driving layer DRL may include a circuit for driving the light-emitting layer EML of the pixel. The circuit driving layer DRL may include a plurality of thin-film transistors.

The light-emitting layer EML may be located on the circuit driving layer DRL. The light-emitting layer EML may include an organic light-emitting layer. The light-emitting layer EML may emit light with various levels of luminance according to a driving signal transmitted from the circuit driving layer DRL.

The encapsulation layer ENL may be located on the light-emitting layer EML. The encapsulation layer ENL may include an inorganic film, or a stacked film of an inorganic film and an organic film.

The touch layer TSL may be located on the encapsulation layer ENL. The touch layer TSL may be a layer that detects a touch input, and may perform a function of a touch member. The touch layer TSL may include a plurality of sensing areas and a plurality of sensing electrodes.

Referring to FIG. 4 again, the upper stacked structure 200 and the lower stacked structure 300 may be located on the upper surface and the lower surface of the display panel 100, respectively.

The upper stacked structure 200 may include a polarizing member 225 and a window member W that are sequentially stacked upward from the display panel 100.

The polarizing member 225 may be located on the upper surface of the display panel 100. The polarizing member 225 may polarize light passing therethrough. The polarizing member 225 may serve to reduce the reflection of external light. In some embodiments, the polarizing member 225 may be a polarizing film. The polarizing film may include a polarizing layer and protective substrates sandwiching the polarizing layer therebetween. The polarizing layer may include a polyvinyl alcohol film. The polarizing layer may be stretched in one direction. A stretching direction of the polarizing layer may be an absorption axis, and a direction perpendicular to the stretching direction may be a transmission axis. The protective substrates may be located on one surface and the other surface of the polarizing layer, respectively. The protective substrates may be made of a cellulose resin, such as triacetyl cellulose or a polyester resin, but the present disclosure is not limited thereto.

The window member W may be located on an upper surface of the polarizing member 225. The window member W serves to protect the display panel 100. The window member W may be made of a transparent material. For example, the window member W may include glass or plastic. In some embodiments, the window member W may be made of glass, but the present disclosure is not limited thereto.

When the window member W is made of plastic, the window member W may be vulnerable to a dent or scratch caused by an external force, and may have a large amount of deformation due to an external impact, and thus might not sufficiently perform the function of protecting the display panel 100. When the window member W is made of a thin film glass having a thickness of about 30 μm, such as an ultrathin glass, the window member W may be easily broken due to an external impact.

Contrastingly, the window member W of the display device 1 according to some embodiments is made of a glass material, but has a relatively great thickness of about 0.1 mm or more, thereby securing improved durability.

Accordingly, a separate member for protecting the window member W, such as a window member protective layer to be described below, may be omitted, and an upper surface of the window member W may be directly exposed to the outside. A detailed configuration of the window member W will be described below with reference to FIGS. 6 to 8.

In other embodiments, the upper stacked structure 200 may further include the window member protective layer that is located on the window member W and protects the window member W. The window member protective layer may be implemented with, for example, a transparent polymer film including at least one selected from among polyethylene terephthalate (PET), polyethylene naphthalate (PEN), polyether sulfone (PES), polyimide (PI), polyarylate (PAR), polycarbonate (PC), polymethylmethacrylate (PMMA), and a cycloolefin polymer (COP) resin.

The upper stacked structure 200 may include upper coupling members 252 and 253 that couple adjacent stacked members. The upper coupling members 252 and 253 may be optically transparent. For example, a first coupling member 252 may be located between the window member W and the polarizing member 225 to couple the window member W and the polarizing member 225, and a second coupling member 253 may be located between the polarizing member 225 and the display panel 100 to couple the polarizing member 225 and the display panel 100.

The lower stacked structure 300 may be located below the display panel 100. The lower stacked structure 300 may include a polymer film layer 310 and heat dissipation members 320, which are sequentially stacked downward from the display panel 100.

The polymer film layer 310 may include a polymer film. For example, the polymer film layer 310 may include polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), cycloolefin polymer (COP), or the like. The polymer film layer 310 may include a functional layer on at least one surface thereof. The functional layer may include, for example, a light-absorbing layer. The light-absorbing layer may include a light absorbing material such as a black pigment or a dye. The light-absorbing layer may be formed on the polymer film through a coating or printing method using black ink.

The heat dissipation members 320 may be located below the polymer film layer 310. The heat dissipation members 320 serve to diffuse heat generated from the display panel 100 or other components of the display device 1. The heat dissipation members 320 may include a heat dissipation sheet including graphite or carbon nanotubes or a metal plate. In some embodiments, as shown in FIGS. 3 and 4, the heat dissipation members 320 may be separated based on the folding area FA so that the display device 1 is smoothly folded. In some embodiments, the heat dissipation members 320 may be connected as one member.

The lower stacked structure 300 may include rear coupling members 351 and 352 that couple adjacent stacked members. For example, a third coupling member 351 may be located between the display panel 100 and the polymer film layer 310 to couple the display panel 100 and the polymer film layer 310, and a fourth coupling member 352 may be located between the polymer film layer 310 and the heat dissipation member 320 to couple the polymer film layer 310 and the heat dissipation member 320.

In some embodiments, the lower stacked structure 300 may further include a buffer member. The buffer member may be located between, for example, the polymer film layer 310 and the heat dissipation member 320.

Figure 6:
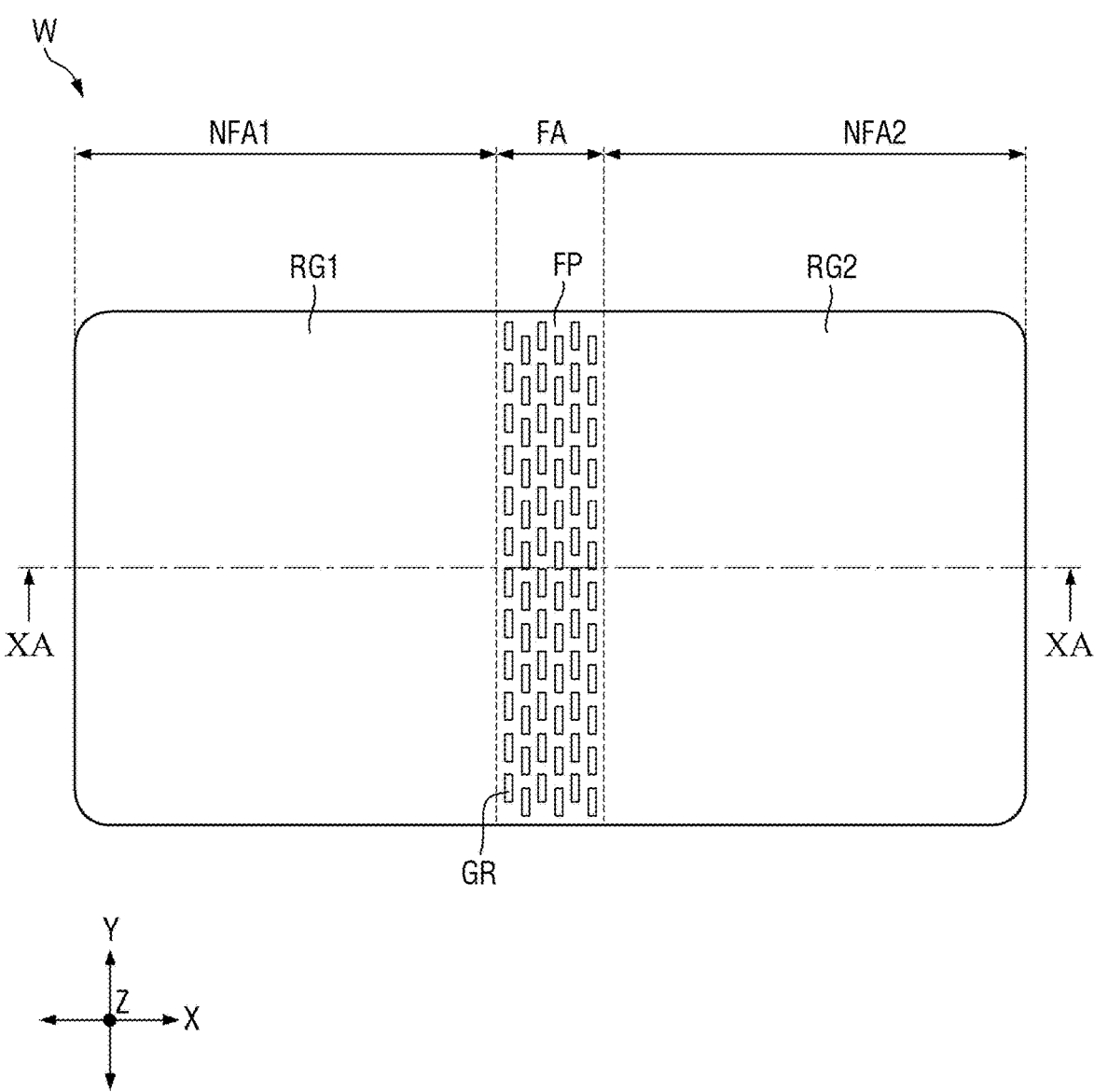
FIG. 6 is a plan view of a window member according to some embodiments.
Figure 7:
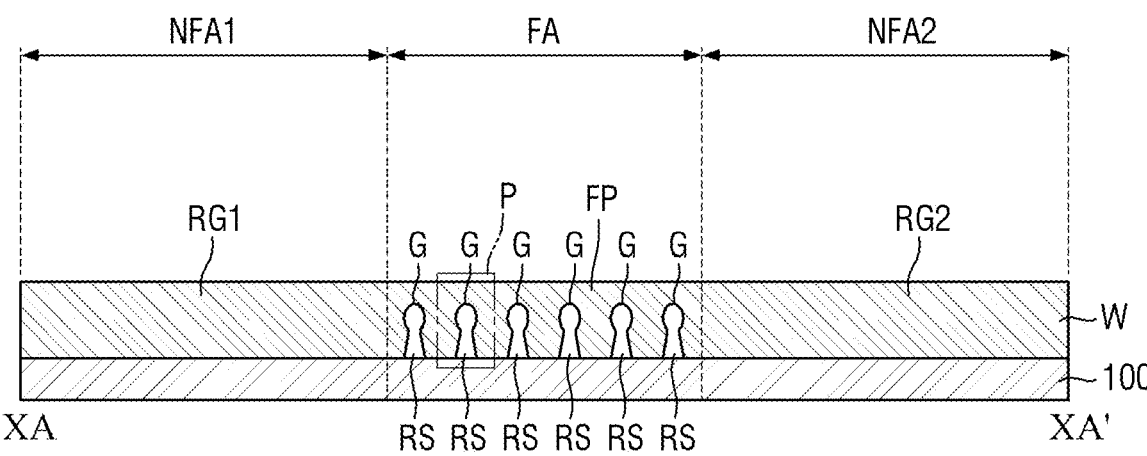
FIG. 7 is a cross-sectional view taken along the line XA-XA' of FIG. 6.
Figure 7:
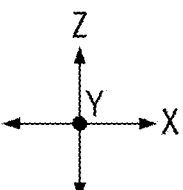
Figure 8:
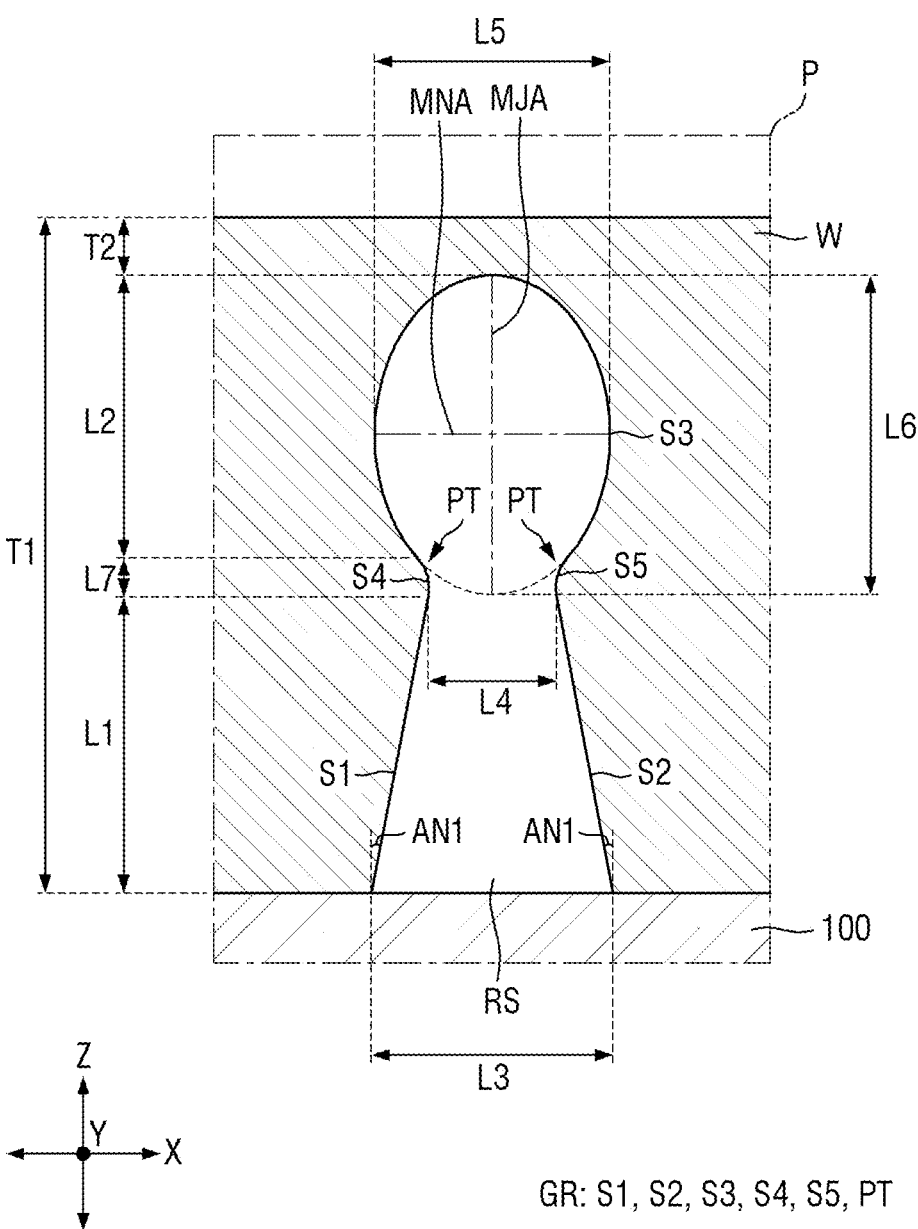
FIG. 8 is a cross-sectional view of portion P of FIG. 7.

FIG. 6 is a plan view of the window member according to some embodiments, FIG. 7 is a cross-sectional view taken along the line XA-XA' of FIG. 6, and FIG. 8 is a cross-sectional view of portion P of FIG. 7.

For convenience of description, in FIGS. 6 to 8, other members other than the window member W and the display panel 100 are omitted.

Referring to FIG. 6, the window member W may be located throughout the first non-folding area NFA1, the folding area FA, and the second non-folding area NFA2. As shown in FIGS. 1, 2, and 3, as the display module DM and the support member SM of the display device 1 are folded and unfolded, the window member W of the display module DM may also be folded and unfolded together therewith.

The window member W may have an approximately rectangular shape elongated in the first direction X in a plan view. In some embodiments, the window member W may include two long sides in the first direction X, and two short sides in the second direction Y, but the present disclosure is not limited thereto.

As described above, the window member W may be made of a transparent material. For example, the window member W may be made of a rigid material such as glass, polycarbonate (PC), polycarbonate (PMMA), a silicone resin, a transparent metal material, or the like. In some embodiments, the window member W is made of glass, but the present disclosure is not limited thereto. The glass may include, for example, soda lime glass, alkali aluminosilicate glass, borosilicate glass, or lithium aluminosilicate glass.

The window member W may include chemically strengthened or thermally strengthened glass to have high strength. The chemical strengthening may be performed through an ion exchange treatment process in an alkali salt. The ion exchange treatment process may be performed two or more times.

The window member W may also be made of a transparent plastic material. For example, the window member W may be made of at least one among polyimide, polyacrylate, polymethylmethacrylate (PMMA), polycarbonate (PC), polyethylene naphthalate (PEN), polyvinylidene chloride, polyvinylidene difluoride (PVDF), polystyrene, an ethylene-vinyl alcohol copolymer, polyethersulfone (PES), polyetherimide (PEI), polyphenylene sulfide (PPS), polyallylate, triacetyl cellulose (TAC), and cellulose acetate propionate (CAP).

The window member W may include a first rigid portion RG1, a second rigid portion RG2, and a flexible portion FP. The first rigid portion RG1 and the second rigid portion RG2 may each be formed of a plate-shaped member having a substantially rectangular shape in a plan view. The first rigid portion RG1 and the second rigid portion RG2 may be located in the first non-folding area NFA1 and the second non-folding area NFA2, respectively. In some embodiments, the flexible portion FP may have a smaller area than the first rigid portion RG1 and the second rigid portion RG2, and the first rigid portion RG1 and the second rigid portion RG2 may be located symmetrically with respect to the flexible portion FP, but the present disclosure is not limited thereto.

The first rigid portion RG1 and the second rigid portion RG2 may have a greater rigidity than other portions, for example, may have a greater rigidity than the flexible portion FP. The first rigid portion RG1 and the second rigid portion RG2 may have less flexibility than the flexible portion FP.

The flexible portion FP may be located in the folding area FA. The flexible portion FP may be located between the first rigid portion RG1 and the second rigid portion RG2. One side of the flexible portion FP may be connected to the first rigid portion RG1, and the other side thereof may be connected to the second rigid portion RG2. The flexible portion FP may have less rigidity than the first rigid portion RG1 and the second rigid portion RG2. The flexible portion FP may have a greater flexibility than the first rigid portion RG1 and the second rigid portion RG2.

The first rigid portion RG1 and the second rigid portion RG2 may be portions in which deformation hardly occurs when the display device 1 is folded or unfolded, and the flexible portion FP may be a portion in which greater deformation occurs than in other portions when the display device 1 is folded or unfolded.

The window member W is formed of glass made of a rigid material, and may have a thickness of about 0.1 mm or more. For example, the thickness of the window member W may be in a range of about 0.1 mm to about 1.0 mm. Accordingly, unlike an ultrathin glass whose thickness is about 30 μm, the flexible portion FP on which a pattern for reducing a bending rigidity is formed is folded when the display device 1 is folded, but the first rigid portion RG1 and the second rigid portion RG2 on which the pattern is not formed may be hardly folded or deformed, and may maintain a flat shape.

The window member W may further include a plurality of grooves GR.

The plurality of grooves GR may be located in the flexible portion FP. The plurality of grooves GR may be located so as to form a pattern in the flexible portion FP. As shown in FIG. 6, the plurality of grooves GR may form a plurality of columns extending in the second direction Y in a plan view, and may be arranged to have, for example, a zigzag shape in which the plurality of adjacent grooves GR only partially overlap each other in the first direction X in a plan view, but the present disclosure is not limited thereto. The plurality of grooves GR may lower the bending rigidity of the flexible portion FP to allow the flexible portion FP of the window member W to be easily folded when the display device 1 is folded. In some embodiments, the grooves GR may each have a rectangular shape or slit shape elongated in the second direction Y in a plan view, but the present disclosure is not limited thereto.

With further reference to FIG. 7, the grooves GR may each be recessed in a thickness direction of the window member W. The groove GR may be recessed from one surface of the window member W toward the other surface of the window member W. One surface of the window member W may be a surface facing the display panel 100, and the other surface of the window member W may be a surface opposite to the one surface of the window member W. The one surface of the window member W may be a lower surface of the window member W, and the other surface of the window member W may be an upper surface of the window member W. As described above, the upper surface of the window member W may be directly exposed to the outside.

The groove GR may have a rounded end portion in a cross-sectional view. As shown in FIG. 7, the groove GR may have an end portion that is convex toward the upper surface of the window member W. That is, the end portion of the groove GR may be round-processed. In other words, a bottom surface of the groove GR may be formed to have a concave curvature toward the upper surface of the window member W. The end portion of the groove GR may refer to an uppermost end portion of the groove GR, which is adjacent to the upper surface of the window member W, as well as a portion adjacent to the uppermost end portion. The end portion of the groove GR may also refer to the bottom surface of the groove GR.

Because the end portion of the groove GR is rounded, when the window member W is folded or unfolded, stress concentration at the end portion of the groove GR may be relieved. That is, as the end portion of the groove GR has a rounded shape, a stress concentration coefficient of the window member W may be lowered in comparison with a case in which the groove GR has a sharp end portion. Accordingly, damage or breakage of the window member W may be reduced or prevented, thereby improving the durability of the window member W.

The display device 1 may further include a plurality of filling members RS that are filled in the plurality of grooves GR, respectively. The rigidity of the filling members RS may be less than that of the window member W. The filling members RS may be made of a material having flexibility. The shape of the filling member RS may vary depending on the size of the groove GR that varies when the window member W is folded. The filling member RS may include a resin. For example, the filling member RS may include a silicone-based resin, an epoxy-based resin, a polyurethane-based resin, or a polyethylene-based resin, but the present disclosure is not limited thereto.

The filling member RS may have a refractive index substantially the same as the window member W. Accordingly, an interface between the groove GR and the filling member RS may be prevented from being viewed from the outside. For example, the refractive index of each of the window member W and the filling member RS may be in a range of about 1.4 to about 1.6. As another example, a refractive index difference between the window member W and the filling member RS may be about 0.0001 or less.

With further reference to FIG. 8, a width of the groove GR may vary in the thickness direction of the window member W. The width of the groove GR may gradually decrease, and then increase, from one surface of the window member W toward the other surface of the window member W, and then may decrease again as it approaches the end portion of the groove GR. For example, the groove GR may have a key hole-like shape having a rounded end and a narrow middle in a cross-sectional view. In FIG. 7, the width of each of the plurality of grooves GR in the first direction X is illustrated as being variable, but the present disclosure is not limited thereto. The width of each of the plurality of grooves GR may also refer to a width in the second direction Y.

The window member W may have a first thickness T1. The first thickness T1 may refer to a distance measured in the third direction Z from the upper surface of the window member W to the lower surface of the window member W. The first thickness T1 may include a maximum thickness and an average thickness. As described above, the first thickness T1 may be in a range of about 0.1 mm to about 1.0 mm.

The end portion of the groove GR may be spaced apart from the upper surface of the window member W. That is, the groove GR may be formed not to completely pass through the window member W.

A portion of the window member W in which the groove GR is formed may have a second thickness T2 that is less than the first thickness T1. The second thickness T2 may refer to a distance measured from the upper surface of the window member W to the end portion of the groove GR and/or the uppermost end portion of the groove GR. The second thickness T2 may be less than or equal to half of the first thickness T1. That is, the thickness of the window member W measured from the end portion of the groove GR to the upper surface of the window member W may be less than a depth of the groove GR. For example, the second thickness T2 may be about 30 μm or less. Although the window member W is made of the rigid material, because the second thickness T2 has a sufficiently small value, when the window member W is folded, the portion of the window member W, in which the groove GR is formed, may be bent.

As shown in FIG. 8, the plurality of grooves GR may include a first inner surface S1, a second inner surface S2, and a rounded surface S3.

The first inner surface S1 may have one side connected to the lower surface of the window member W, and may extend flatly in the upward direction toward the upper surface of the window member W. The other side of the first inner surface S1 may be connected to one side of the rounded surface S3 through a fourth inner surface S4, which will be described below. However, the present disclosure is not limited thereto, and the other side of the first inner surface S1 may be directly connected to the rounded surface S3. In other embodiments, the first inner surface S1 may also include a curved surface. The one side and the other side of the first inner surface S1 may refer to one end and the other end of the first inner surface S1, respectively.

The second inner surface S2 may be located to face the first inner surface S1. The second inner surface S2 may have one side connected to the lower surface of the window member W, and may extend flatly in the upward direction toward the upper surface of the window member W. The other side of the second inner surface S2 may be connected to the other side of the rounded surface S3 through a fifth inner surface S5, which will be described below. However, the present disclosure is not limited thereto, and the other side of the second inner surface S2 may be directly connected to the rounded surface S3. In other embodiments, the second inner surface S2 may also include a curved surface. The one side and the other side of the second inner surface S2 may refer to one end and the other end of the second inner surface S2, respectively.

The first inner surface S1 and the second inner surface S2 may be located to be inclined in different directions such that the width of the groove GR is narrowed as a result. As shown in FIG. 8, the first inner surface S1 may extend from the lower surface of the window member W in an upper right direction, and the second inner surface S2 may extend from the lower surface of the window member W in an upper left direction. In FIG. 8, the first inner surface S1 and the second inner surface S2 have the same slope, but the present disclosure is not limited thereto. The first inner surface S1 and the second inner surface S2 may also have different slopes in other embodiments.

Each of the first inner surface S1 and the second inner surface S2 may be inclined by a first angle AN1 with respect to a normal line that is perpendicular to the upper or lower surface of the window member W. For example, the first angle AN1 may be in a range of about 30° to about 70°. As another example, the first angle AN1 may be about 45°. When the first angle AN1 is small (for example, when the first angle AN1 is about 45° or less), the resin (e.g., the filling member RS) may be relatively easily injected, but the width of each of the plurality of grooves GR may increase. Accordingly, the groove GR may be easily viewed from the outside, and a pitch between the plurality of grooves GR may increase. When the first angle AN1 is large (for example, when the first angle AN1 is about 45° or more), the width of each of the plurality of grooves GR may decrease, and the pitch between the plurality of grooves GR may be reduced so that visibility of the groove GR may be lowered.

One side of the rounded surface S3 may be connected to the fourth inner surface S4, and the other side thereof may be connected to the fifth inner surface S5. The rounded surface S3 may have a concave curvature toward the upper surface of the window member W. The rounded surface S3 may form an inner space with a portion open downward. In other embodiments, one side of the rounded surface S3 may be directly connected to the other side of the first inner surface S1, and the other side thereof may be directly connected to the other side of the second inner surface S2. The one side and the other side of the rounded surface S3 may refer to one end and the other end of the rounded surface S3.

The rounded surface S3 may have an elliptical shape partially open downward toward the lower surface of the window member W (e.g., toward the display panel 100) in a cross-sectional view. The portion of the rounded surface S3 may refer to a portion between one side of the rounded surface S3 connected to the first inner surface S1 and the other side of the rounded surface S3 connected to the second inner surface S2. The rounded surface S3 may be located to have an arc shape that forms a portion of a circumference of a virtual ellipse having a major axis MJA and a minor axis MNA in a cross-sectional view. The rounded surface S3 may form an elliptical inner space partially open downward.

As shown in FIG. 8, the rounded surface S3 may have an elliptical shape elongated in the thickness direction. The elliptical shape may have the major axis MJA in the third direction Z, and the minor axis MNA in the first direction X. The third direction Z may be the thickness direction, and the first direction X may be the length direction or width direction. The first direction X may be a direction in which a tensile force or a compressive force is applied to the window member W.

Each of the plurality of grooves GR may further include the fourth inner surface S4 and the fifth inner surface S5. The fourth inner surface S4 may connect the other side of the first inner surface S1 and one side of the rounded surface S3. The fifth inner surface S5 may connect the other side of the second inner surface S2 and the other side of the rounded surface S3. The fourth inner surface S4 and the fifth inner surface S5 may each have a convex curvature. The fourth inner surface S4 may connect the first inner surface S1 and the rounded surface S3 so that the first inner surface S1, the fourth inner surface S4, and the rounded surface S3 have a continuous curvature. The fifth inner surface S5 may connect the second inner surface S2 and the rounded surface S3 so that the second inner surface S2, the fifth inner surface S5, and the rounded surface S3 have a continuous curvature.

The fourth inner surface S4 and the fifth inner surface S5 may prevent edges from being formed between the first inner surface S1 and the rounded surface S3, or between the second inner surface S2 and the rounded surface S3, respectively, and may allow the first inner surface S1, the fourth inner surface S4, the rounded surface S3, the fifth inner surface S5, and the second inner surface S2 to form a continuous curved surface, thereby relieving stress concentration in any specific portion of the groove GR, for example, in an edge portion.

The groove GR may include a pair of protrusions PT protruding toward an inside of the groove GR so that the width of the groove GR decreases in a cross-sectional view. Accordingly, the groove GR may have a shape having a narrow middle in a cross-sectional view.

The first inner surface S1, the second inner surface S2, the fourth inner surface S4, and the fifth inner surface S5 may form side surfaces of the groove GR, and at least a portion of the rounded surface S3 may form the bottom surface of the groove GR.

The first inner surface S1 and the second inner surface S2 may each have a first length L1 in the third direction Z. The rounded surface S3 may have a second length L2 in the third direction Z. The first length L1 and the second length L2 may be a depth and/or a thickness of a portion formed by the first inner surface S1, the second inner surface S2, and the rounded surface S3. The second length L2 may be less than a length L6 of the major axis MJA of the virtual ellipse that may be a reference of a boundary of the rounded surface S3 in a cross-sectional view.

The first length L1 may be greater than the second length L2. In this case, to secure the flexibility of the flexible portion FP, the second thickness T2 has a limited range, and thus it is possible to prevent the second length L2 from being excessively increased. As a result, the curvature of the end portion of the groove GR may be secured, and the resin may be easily injected into the groove GR. However, the present disclosure is not limited thereto, and the first length L1 may be less than or equal to the second length L2.

The inner space of the groove GR formed by the first inner surface S1 and the second inner surface S2 may have different widths depending on the depth. The width may refer to an average width and/or a maximum width. In more detail, a first width L3 between one side of the first inner surface S1 and one side of the second inner surface S2 may be greater than a second width L4 between the other side of the first inner surface S1 and the other side of the second inner surface S2. As shown in FIG. 8, the first width L3 and the second width L4 may be widths in the first direction X, but the present disclosure is not limited thereto. The widths may be widths in the second direction Y.

The rounded surface S3 may have a third width L5 in the first direction X. The third width L5 may refer to a maximum width of the rounded surface S3. The rounded surface S3 may have the maximum width at the middle between the end portion of the groove GR and one side of the rounded surface S3 (or the other side of the rounded surface S3) in a cross-sectional view. The third width L5 may refer to a length of the minor axis MNA of the virtual ellipse that may be a reference of the boundary of the rounded surface S3 in a cross-sectional view. In other embodiments, the third width L5 may be a width in the second direction Y.

The third width L5 may be substantially equal to the first width L3. In this case, boundaries of the rounded surface S3, and one side of the first inner surface S1 and one side of the second inner surface S2 may respectively overlap in the thickness direction in a plan view. Accordingly, the visibility of the groove GR may be lowered. However, the present disclosure is not limited thereto, and the third width L5 may be less than or greater than the first width L3.

The fourth inner surface S4 and the fifth inner surface S5 may each have a third length L7 in the third direction Z. The third length L7 may be less than the first length L1 and the second length L2. The sum of the first length L1, the second length L2, and the third length L7 may refer to a total depth of the groove GR.

Figure 9:
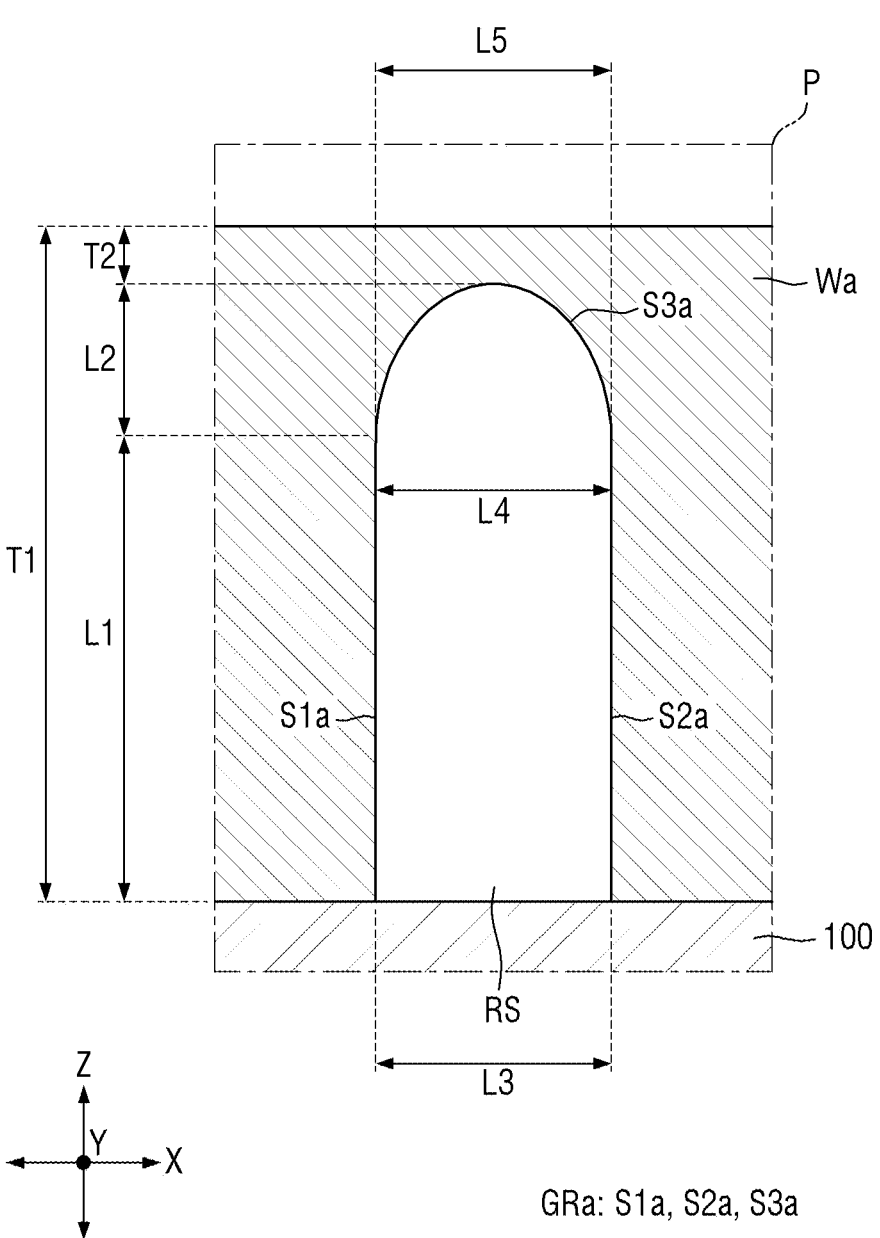
FIG. 9 is a cross-sectional view of portion P according to other embodiments.

FIG. 9 is a cross-sectional view of portion P (shown in FIG. 7) according to other embodiments.

Referring to FIG. 9, unlike the case of FIG. 8, a rounded surface S3a may have an approximately semi-elliptical or semi-circular shape. A third width L5 of the rounded surface S3a may be equal to a second width L4 between the other side of a first inner surface S1a and the other side of a second inner surface S2a. In this case, the third width L5 may refer to a maximum width of the rounded surface S3a, and the rounded surface S3a may have the maximum width at a portion between one side of the rounded surface S3a connected to the other side of the first inner surface S1a, and the other side of the rounded surface S3a connected to the other side of the second inner surface S2a.

The first inner surface S1a and the second inner surface S2a may extend parallel to each other in the third direction Z. In this case, the fourth inner surface S4, the fifth inner surface S5, and the protrusions PT shown in FIG. 8 may be omitted. That is, the first inner surface S1a and the second inner surface S2a may extend in a direction perpendicular to a lower surface of a window member Wa. Accordingly, a filling member RS may be more easily filled in the rounded surface S3a.

A first length L1 may be greater than a second length L2, and a first width L3 may be equal to the second width L4. In other embodiments, the first length L1 may be less than or equal to the second length L2.

The embodiments of FIG. 9 are substantially the same as, or similar to, embodiments of FIG. 8 except for the cross-sectional shape of a groove GRa, and thus, redundant descriptions will be omitted.

Figure 10:
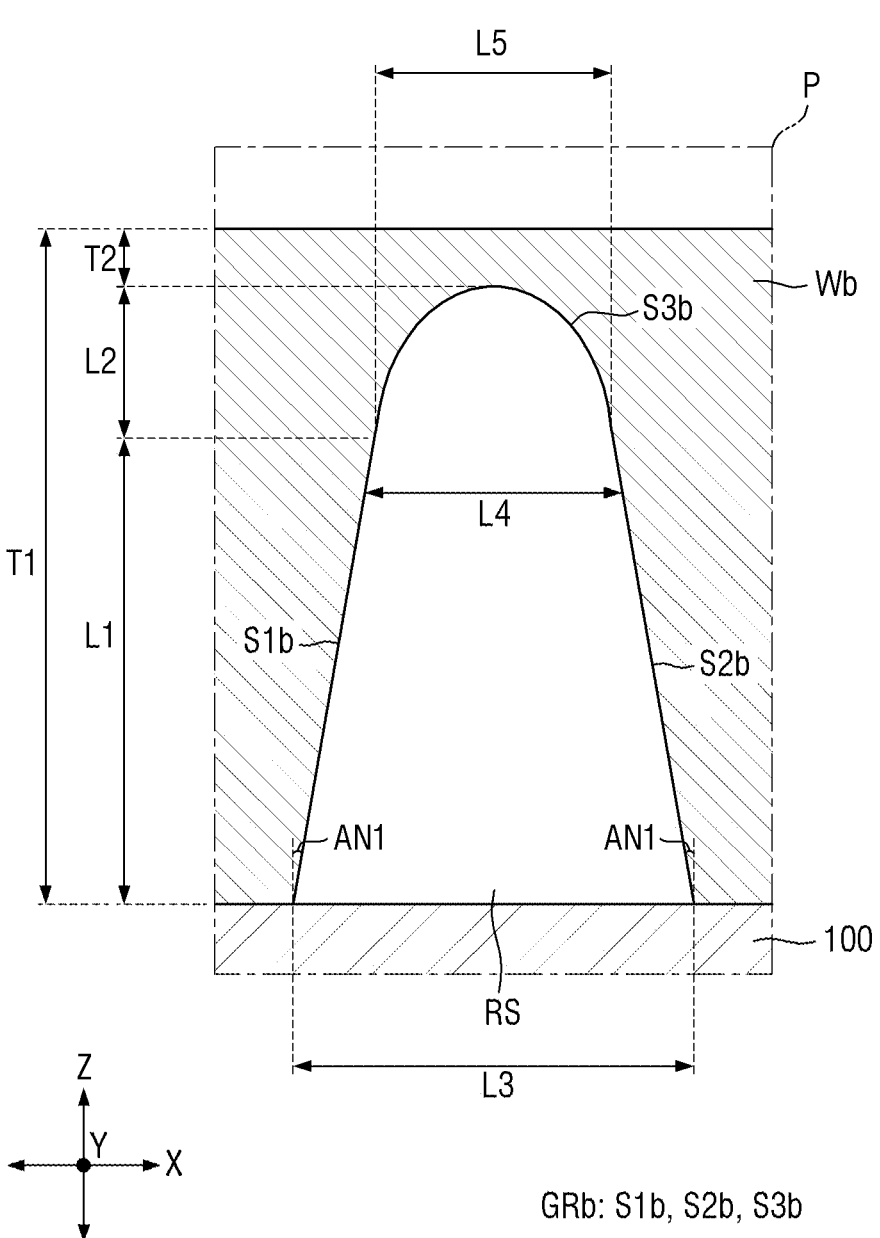
FIG. 10 is a cross-sectional view of portion P according to still other embodiments.

FIG. 10 is a cross-sectional view of portion P (shown in FIG. 7) according to still other embodiments.

Referring to FIG. 10, unlike the embodiments of FIG. 8, a rounded surface S3b may have an approximately semi-elliptical or semi-circular shape. A third width L5 of the rounded surface S3b may be approximately equal to a second width L4 between the other side of a first inner surface S1b and the other side of a second inner surface S2b. In this case, the third width L5 may refer to a maximum width of the rounded surface S3b, and the rounded surface S3b may have the maximum width at a portion between one side of the rounded surface S3b connected to the other side of the first inner surface S1b, and the other side of the rounded surface S3b connected to the other side of the second inner surface S2b.

The first inner surface S1b and the second inner surface S2b may be located to be inclined with respect to a lower surface of a window member Wb. Similar to the embodiments of FIG. 8, the first inner surface S1b and the second inner surface S2b may be located such that a width of a groove GRb becomes narrower as it approaches an upper surface of the window member Wb from the lower surface of the window member Wb. For example, as shown in FIG. 10, the first inner surface S1b may extend from the lower surface of the window member Wb in an upper right direction, and the second inner surface S2b may extend from the lower surface of the window member Wb in an upper left direction.

Each of the first inner surface S1b and the second inner surface S2b may be located to be inclined by a first angle AN1 with respect to a normal line perpendicular to the lower surface of the window member Wb. As described above, the first angle AN1 may be in a range of about 30° to about 70°.

A first length L1 may be greater than a second length L2. However, the present disclosure is not limited thereto, and the first length L1 may be less than or equal to the second length L2.

A first width L3 between one side of the first inner surface S1b and one side of the second inner surface S2b may be greater than the second width L4 between the other side of the first inner surface S1b and the other side of the second inner surface S2b. The fourth inner surface S4, the fifth inner surface S5, and the protrusions PT may be omitted, and the width of the groove GRb may gradually decrease toward the upper surface of the window member WB from the lower surface of the window member Wb. Accordingly, a filling member RS may be more easily filled in the groove GRb.

The embodiments of FIG. 10 are substantially the same as, or similar to, embodiments of FIG. 8 except for the cross-sectional shape of the groove GRb, and thus, redundant descriptions will be omitted.

Figure 11:
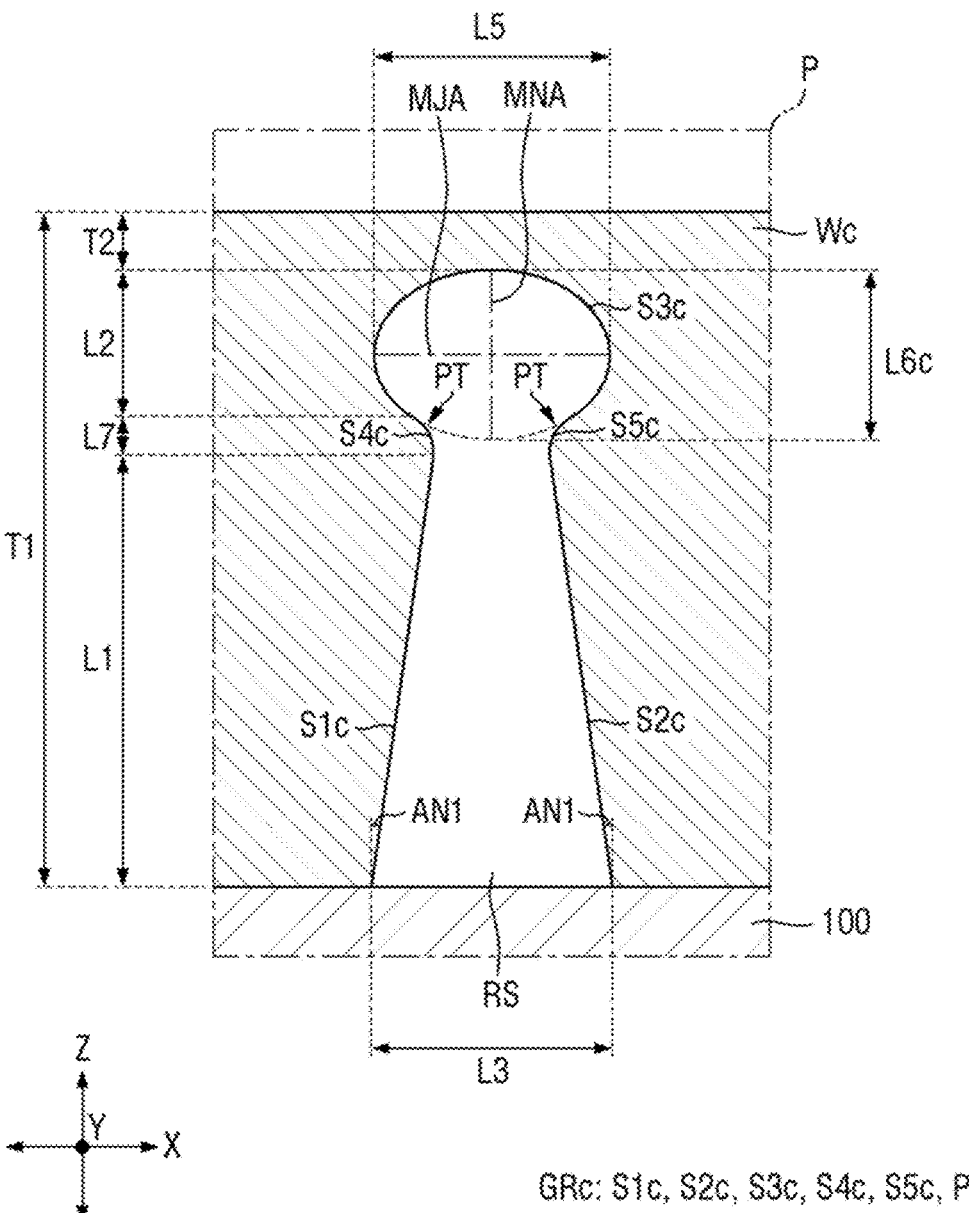
FIG. 11 is a cross-sectional view of portion P according to yet other embodiments.

FIG. 11 is a cross-sectional view of portion P (shown in FIG. 7) according to yet other embodiments.

Referring to FIG. 11, unlike embodiments of FIG. 8, a cross-section of a rounded surface S3c may have an elliptical shape elongated in the first direction X. For example, the rounded surface S3c may have an elliptical-shaped cross-section partially open downward, and the elliptical shape may have a major axis MJA in the first direction X and a minor axis MNA in the third direction Z. A third width L5 of the rounded surface S3c may be greater than a second length L2, and may be greater than a length L6c of the minor axis MNA. The third width L5 may refer to a length of the major axis MJA.

The first direction X may be a length direction or a width direction, and the third direction Z may be a thickness direction. The first direction X may be a general direction in which a tensile force or a compressive force is applied to a window member Wc.

As shown in FIG. 11, because the rounded surface S3c has an elliptical shape elongated in a direction in which a tensile force or a compressive force is applied in a cross-sectional view, the window member Wc of FIG. 11 may have a lower stress concentration coefficient than that of embodiments of FIG. 8.

Similar to embodiments of FIG. 8, the third width L5 may be equal to a first width L3. However, the present disclosure is not limited thereto, and the third width L5 may be greater than or less than the first width L3.

The embodiments of FIG. 11 are substantially the same as, or similar to, embodiments of FIG. 8 except for the cross-sectional shape of a groove GRc, and thus, redundant descriptions will be omitted.

Figure 12:
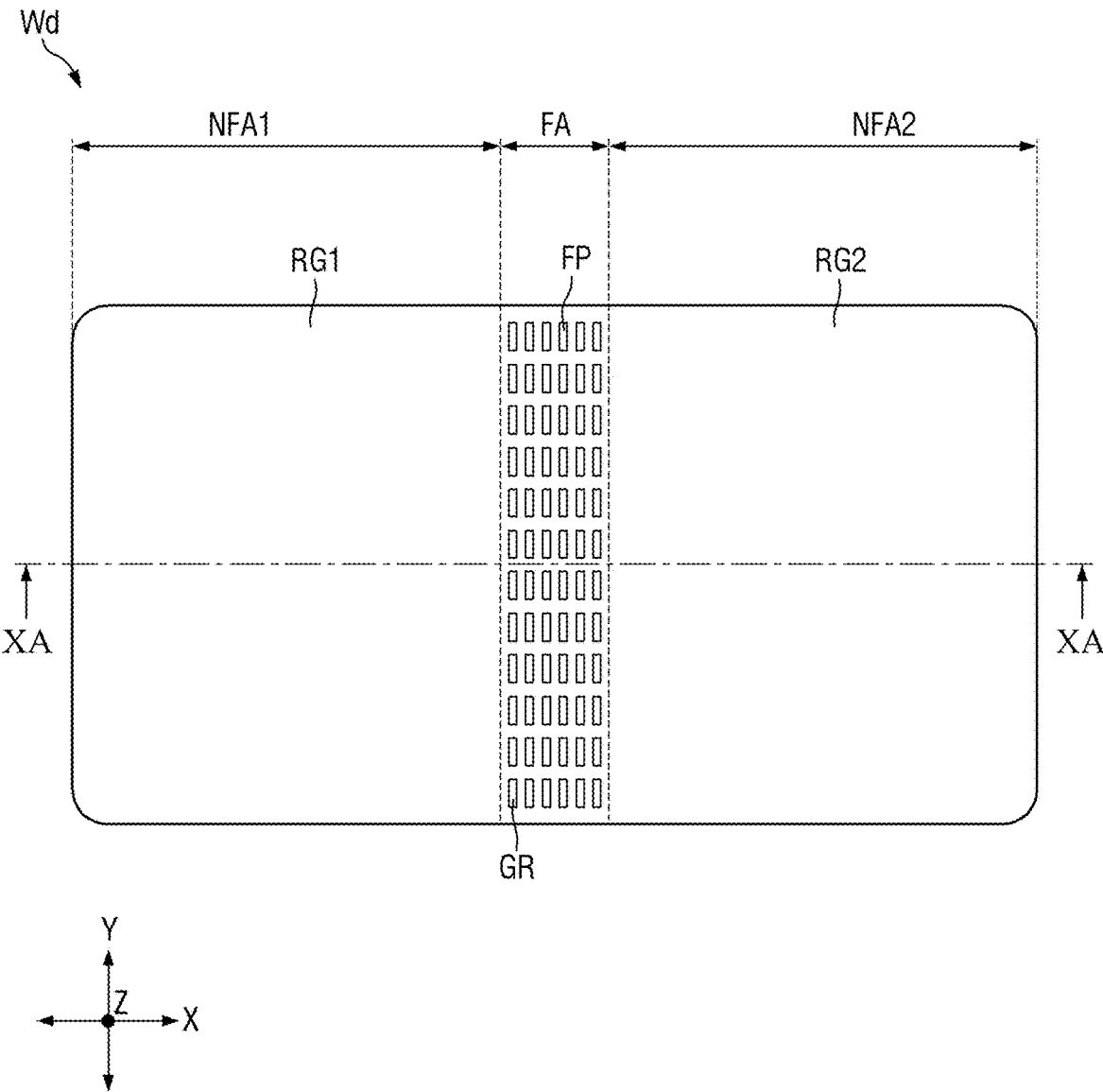
FIG. 12 is a plan view of a window member according to yet other embodiments.

FIG. 12 is a plan view of a window member according to yet other embodiments.

Referring to FIG. 12, a plurality of grooves GR may be arranged in a matrix form having a plurality of rows extending in the first direction X and a plurality of columns extending in the second direction Y. The number of the plurality of rows may be more than the number of the plurality of columns, but the present disclosure is not limited thereto.

Unlike embodiments of FIG. 6, in embodiments of FIG. 12, the grooves GR may be arranged such that the grooves GR constituting one column completely overlap the grooves GR constituting the adjacent column, respectively, in the first direction X. In this case, the remaining portion (remaining area) of a window member Wd located in the folding area FA, which excludes portions in which the plurality of grooves GR are formed, may have an approximately lattice-shaped pattern extending in the first direction X and the second direction Y in a plan view, but the present disclosure is not limited thereto.

The embodiments of FIG. 12 are substantially the same as, or similar to, the embodiments of FIGS. 6 to 8 except for the arrangement of the plurality of grooves GR, and thus, redundant descriptions will be omitted.

Figure 13:
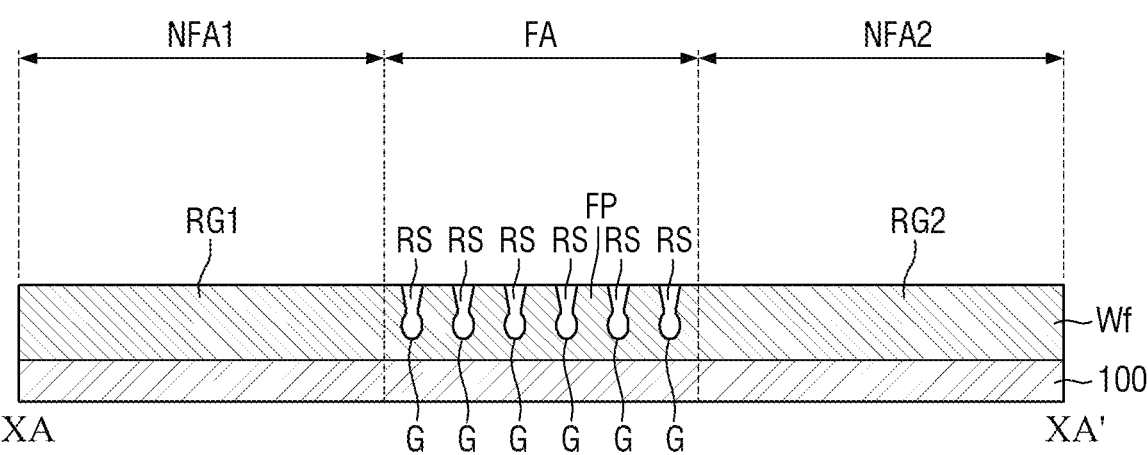
FIG. 13 is a cross-sectional view of the window member according to yet other embodiments.
Figure 13:
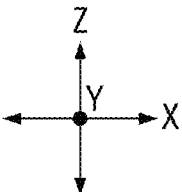

FIG. 13 is a cross-sectional view of a window member according to yet other embodiments.

Referring to FIGS. 3 and 13, as described above, a display device 1 may be out-folded. In this case, unlike embodiments of FIG. 7, a plurality of grooves GR may be recessed from the other surface of a window member Wf toward one surface of the window member Wf. As described above, the one surface of the window member Wf may be a lower surface of the window member Wf facing the display panel 100, and the other surface of the window member Wf may be an upper surface of the window member Wf, which is opposite to the lower surface of the window member Wf. That is, a direction in which the groove GR is recessed may vary depending on the folding direction and/or the folding method of the display device 1. However, the present disclosure is not limited thereto, and the display device 1 may be configured to be in-foldable, or may be configured to be both in-foldable and out-foldable.

When the display device 1 is out-folded, one open side of the groove GR (for example, an upper side of the groove GR in FIG. 13) and one side of a filling member RS filled in an inside of the groove GR (for example, an upper side of the filling member RS in FIG. 13) may be exposed to the outside. In other embodiments, the display device 1 may further include a protective layer located on the upper surface of the window member Wf to cover an upper end of the groove GR and an upper end of the filling member RS. As described above, the filling member RS and the window member Wf may have substantially the same refractive index, and thus visibility of an interface between the groove GR and the filling member RS may be reduced or prevented.

The embodiments of FIG. 13 are substantially the same as, or similar to, some embodiments of FIGS. 6 to 8 except for the recessed direction of the plurality of grooves GR, and thus, redundant descriptions will be omitted.

Figure 14:
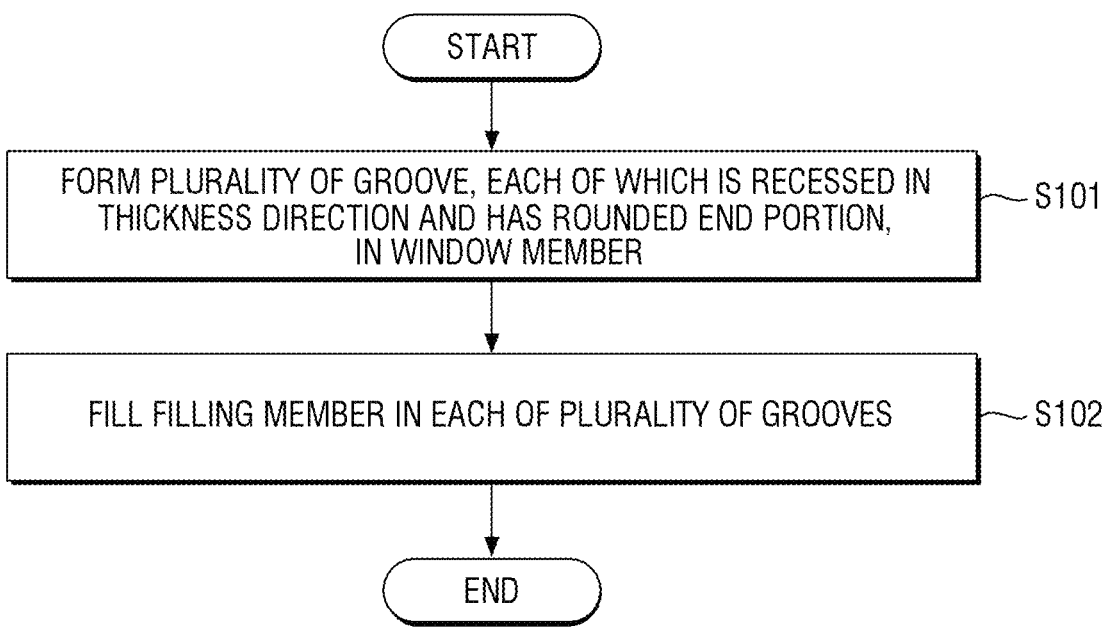
FIG. 14 is a flowchart of a method of manufacturing a display device according to some embodiments.

FIG. 14 is a flowchart of a method of manufacturing a display device according to some embodiments, and FIGS. 15 to 18 are diagrams illustrating operations of the method of manufacturing a display device according to some embodiments.

Referring to FIG. 14, the method of manufacturing a display device according to some embodiments may include forming a plurality of grooves GR, each of which is recessed in a thickness direction and has a rounded end portion, in a window member W (S101), and filling a filling member RS having the same refractive index as the window member W in each of the plurality of grooves GR (S102).

However, the method of manufacturing a display device 1 is not limited to the above example, and at least some of the operations may be omitted, or the method of manufacturing the display device 1 may further include at least one operation by referring to other descriptions of the present specification.

Hereinafter, the method of manufacturing a display device will be described in detail with further reference to FIGS. 15 to 18.

For convenience of description, unlike that in FIGS. 4 and 7 to 11, the window member W in FIGS. 15 to 18 is shown in a vertically inverted state.

Figure 15:
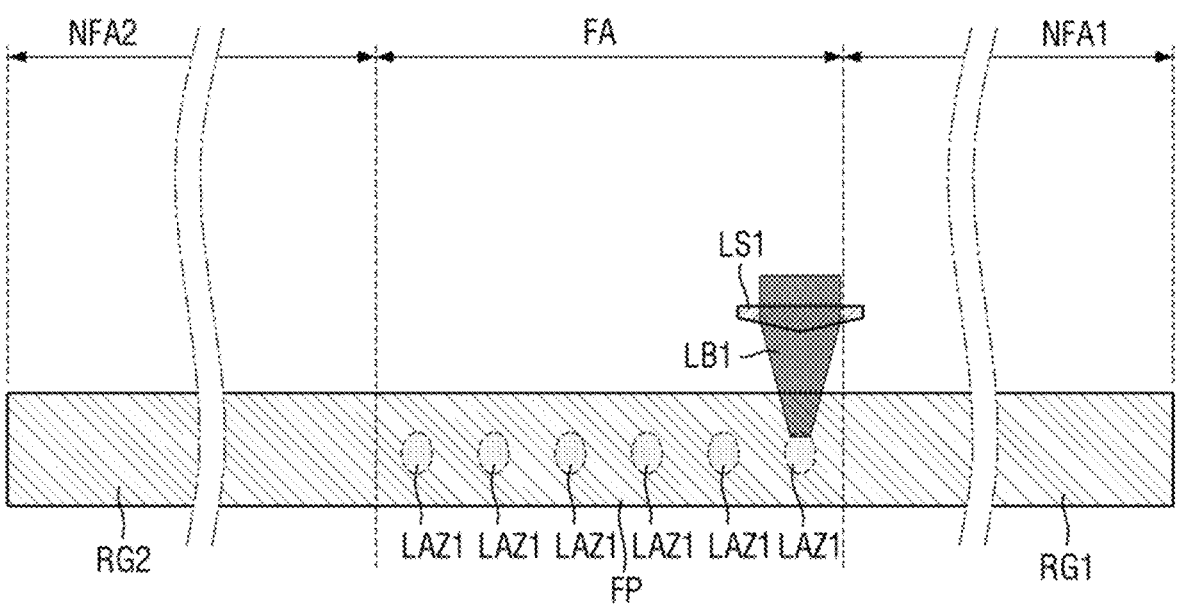
FIGS. 15 to 18 are diagrams illustrating operations of the method of manufacturing a display device according to some embodiments.

Referring to FIG. 15, the window member W may be prepared. The window member W may be in a state in which the plurality of grooves GR are not yet formed. As described above, the window member W is made of a rigid transparent material, such as glass, and may have a thickness of about 0.1 mm or more. The detailed material and thickness of the window member W are may be the same as those described above in FIG. 6.

After the window member W is prepared, a first laser LB1 may be irradiated to a flexible portion FP of the window member W. The first laser LB1 may be irradiated onto one surface of the window member W. With further reference to FIG. 7, the one surface of the window member W may refer to a surface facing the display panel 100.

The first laser LB1 may be a focal point laser. The focal point laser may be formed by a first optical system LS1 having a point focus. As shown in FIG. 15, the first laser LB1 may be concentrated on one point located inside the window member W in a cross-sectional view to form a first laser affected area LAZ1, which may have a circular or elliptical shape, inside the window member W.

The first laser affected area LAZ1 may be an area in which structural deformation of a material constituting the window member W occurs by the irradiation of the laser. For example, when the window member W is made of glass, a Si—O bond in the first laser affected area LAZ1 may be broken or weakened. Accordingly, an etching selectivity of the first laser affected area LAZ1 may increase in comparison with the other portions of the window member W.

Figure 16:
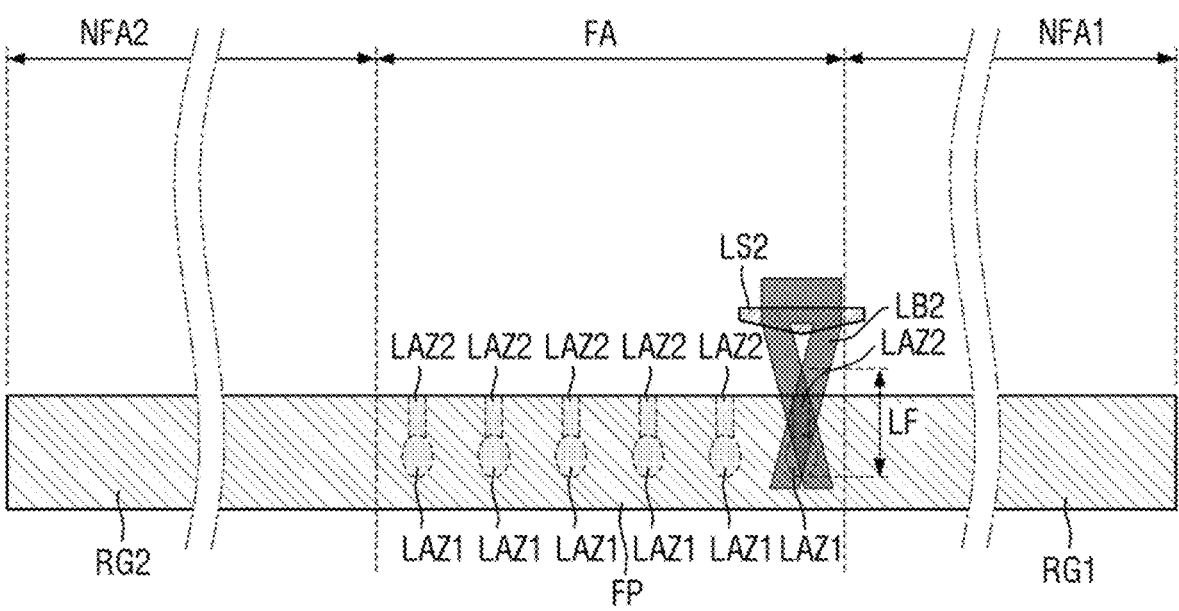

Referring to FIG. 16, after the irradiation of the first laser LB1 is completed, a second laser LB2 may be irradiated to the flexible portion FP of the window member W. Like the first laser LB1, the second laser LB2 may be irradiated onto one surface of the window member W.

The second laser LB2 may be a Bessel beam laser. The Bessel beam laser may be formed by a second optical system LS2 having a linear focus. For example, the second optical system LS2 may include a plano-convex (PCX) axicon lens that forms a conical wavefront. As shown in FIG. 16, the second laser LB2 may form a second laser affected area LAZ2, which may have a linear shape elongated in the thickness direction in a cross-sectional view, inside the window member W. The second laser affected area LAZ2 may be formed to overlap the first laser affected area LAZ1 in the thickness direction. In a cross-sectional view, one side of the second laser affected area LAZ2 may be connected to one surface of the window member W, and the other side of the second laser affected area LAZ2 may be connected to the first laser affected area LAZ1.

Like the first laser affected area LAZ1, the second laser affected area LAZ2 may be an area in which structural deformation of the material constituting the window member W occurs by the irradiation of the laser. Accordingly, an etching selectivity of the second laser affected area LAZ2 may increase in comparison with the other portions of the window member W.

Referring to FIGS. 15 and 16, the first laser LB1 and/or the second laser LB2 may each be an ultrashort pulse laser. The first laser LB1 may be a femtosecond laser. The femtosecond laser may refer to a laser having a pulse width in a range of about 200 femtoseconds to about 500 femtoseconds. However, the laser may also be light in a short wavelength range from a near-infrared (IR) laser to an ultraviolet (UV) laser or light in a multi-wavelength range including light in various wavelength ranges.

In FIGS. 15 and 16, some embodiments in which the Bessel beam laser is irradiated, after the focal point laser is irradiated, are illustrated, but the present disclosure is not limited thereto. For example, after the Bessel beam laser is first irradiated to the window member W, the focal point laser may be irradiated. In this case, the linear second laser affected area LAZ2 is formed first, and then the circular or elliptical first laser affected area LAZ1 may be formed.

Figure 17:
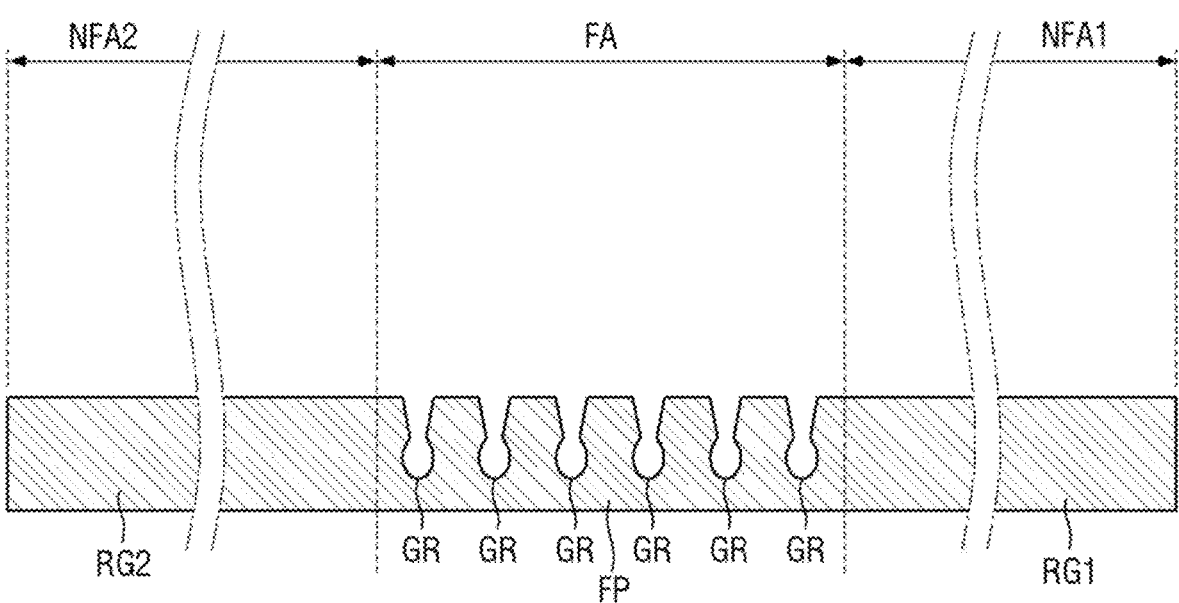

Referring to FIG. 17, after the irradiation of the first laser LB1 and the second laser LB2 is completed, the window member W may be etched. In this case, only one surface of the window member W may be etched, or one surface and the other surface of the window member W may be etched simultaneously. In other embodiments, an etching resist may be attached to the other surface of the window member W.

The window member W may be wet-etched. In the wet etching, for example, a basic solution, such as potassium hydroxide or sodium hydroxide, or an acidic solution, such as hydrofluoric acid, may be used. However, the present disclosure is not limited thereto, and the window member W may be dry-etched.

The window member W may be alternately exposed to different kinds of etching solutions. For example, the window member W may be alternately exposed to a hydrofluoric acid-based etching solution and a non-hydrofluoric acid-based etching solution. The hydrofluoric acid-based etching solution may include hydrofluoric acid, ammonium fluoride, ammonium hydrogen fluoride, or the like. The non-hydrofluoric acid-based etching solution may include potassium hydroxide, sodium hydroxide, or the like. For example, the window member W may be exposed in the order of a hydrofluoric acid-based etching solution, a non-hydrofluoric acid-based etching solution, and a hydrofluoric acid-based etching solution, or may be exposed in the order of a non-hydrofluoric acid-based etching solution, a hydrofluoric acid-based etching solution, and a non-hydrofluoric acid-based etching solution. The hydrofluoric acid-based etching solution and the non-hydrofluoric acid-based etching solution are different from each other in an etch rate, a degree of etching according to the difference in the etching ratio, etching anisotropy, and the like, and thus are appropriately combined to optimize the shape of the groove GR, a process time, and the like.

Because the etching selectivity of the first laser affected area LAZ1 and the second laser affected area LAZ2 is greater than that of the remaining area, the first laser affected area LAZ1 and the second laser affected area LAZ2 are gradually etched from an upper portion thereof so that the window member W in the first laser affected area LAZ1 and the second laser affected area LAZ2 may be partially removed. Accordingly, the plurality of grooves GR may be formed in the flexible portion FP of the window member W.

The shape of each of the plurality of grooves GR may be changed depending on the control of the first laser LB1 and the second laser LB2, the etching process, and the like. The shape of each of the plurality of grooves GR may vary as shown in FIGS. 8, 9, 10, and 11. The specific shape of each of the plurality of grooves GR is as described above in FIGS. 8, 9, 10, and 11.

Figure 18:
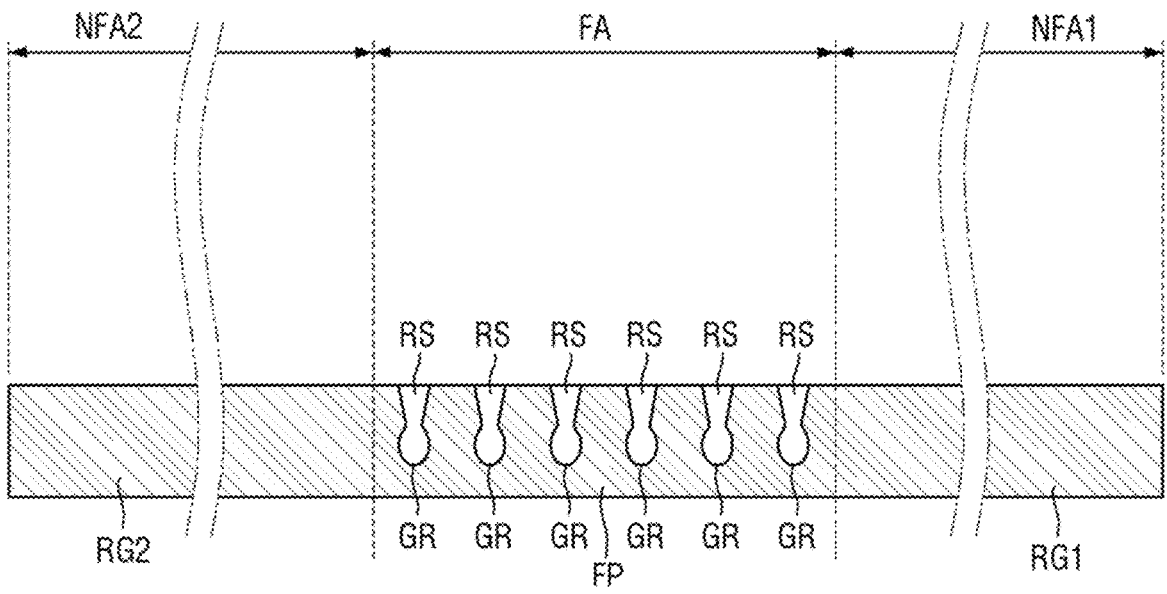

Referring to FIG. 18, after the plurality of grooves GR are formed, a plurality of filling members RS may be filled in the plurality of grooves GR, respectively.

As described above, the filling members RS may each include a resin having a refractive index that is similar to that of the window member W. The filling member RS may include a silicone-based resin, an epoxy-based resin, a polyurethane-based resin, or a polyethylene-based resin, but the present disclosure is not limited thereto.

After the filling of the filling members RS is completed, as shown in FIG. 7, the window member W may be attached to the display panel 100 such that one surface having the plurality of grooves GR formed therein faces the display panel 100.

According to a window member, a display device, and a method of manufacturing the display device according to some embodiments, damage due to concentration of stress can be reduced or prevented.

Aspects of some embodiments are not limited by the content exemplified above, and more various effects are included in the present specification.

In concluding the detailed description, those skilled in the art will appreciate that many variations and modifications can be made to the embodiments without substantially departing from the principles of the present disclosure. Therefore, the disclosed embodiments are used in a generic and descriptive sense only and not for purposes of limitation.

What is claimed is:

1. A window member comprising a first surface, and a second surface opposite to the first surface, and defining first and second grooves at the first surface that are recessed toward the second surface, that have a rounded end portion, and that have a width in a row direction, wherein a thickness of the window member at a portion at which one of the first and second grooves is formed is less than a depth of the one of the first and second grooves, wherein the width of the one of the first and second grooves decreases, then increases, then decreases again from the second surface toward the first surface, wherein the first grooves extend lengthwise in a column direction such that the first grooves are aligned and separated from each other in the column direction to be in a first column having a width in the row direction that is equal to the width of the first grooves in the row direction, wherein the second grooves extend lengthwise in the column direction such that the second grooves are aligned and separated from each other in the column direction to be in a second column having an another width in the row direction that is equal to the width of the second grooves in the row direction, the first column and the second column being adjacent to each other in the row direction and extending from one side of the window member to another side of the window member, and wherein ones of the first grooves are offset from nearest ones of the second grooves in the row direction.

2. The window member of claim 1, wherein the one of the first and second grooves is at least partially defined by:

a first inner surface having a first side connected to the first surface, and extending flatly toward the second surface;

a second inner surface facing the first inner surface, having a first side connected to the first surface, and extending flatly toward the second surface; and a rounded surface connecting a second side of the first inner surface and a second side of the second inner surface, the rounded surface being concave toward the second surface.

3. The window member of claim 2, wherein the first inner surface and the second inner surface are inclined such that the width of the one of the first and second grooves becomes narrower toward the second surface.

4. The window member of claim 2, wherein the rounded surface has an elliptical shape that is partially open toward the first surface in a cross-sectional view.

5. The window member of claim 4, wherein at least one of a length of a major axis of the elliptical shape or a length of a minor axis of the elliptical shape is substantially equal to a width between the first side of the first inner surface and the first side of the second inner surface.

6. The window member of claim 1, wherein the one of the first and second grooves is partially defined by a pair of protrusions protruding toward an inside thereof so that the width of the one of the first and second grooves decreases in a cross-sectional view.

7. The window member of claim 1, wherein the thickness of the window member at the portion at which the one of the first and second grooves is formed is less than or equal to about 30 μm.

8. A display device comprising:

a display panel;

a window member on the display panel having a first surface facing the display panel in a thickness direction, and a second surface opposite to the first surface, and defining first and second grooves that are recessed from the first surface, and that have a width in a row direction; and a filling member filled in one of the first and second grooves, wherein the first grooves extend lengthwise in a column direction such that the first grooves are aligned and separated from each other in the column direction to be in a first column having a width in the row direction that is equal to the width of the first grooves in the row direction, wherein the second grooves extend lengthwise in the column direction such that the second grooves are aligned and separated from each other in the column direction to be in a second column having an another width in the row direction that is equal to the width of the second grooves in the row direction, the first column and the second column being adjacent to each other in the row direction and extending from one side of the window member to another side of the window member, and wherein ones of the first grooves are offset from nearest ones of the second grooves in the row direction.

9. The display device of claim 8, wherein the one of the first and second grooves is at least partially defined by:

a first inner surface that has a first side connected to the first surface of the window member, and that extends flatly toward the second surface of the window member;

a second inner surface that faces the first inner surface, that has a first side connected to the first surface of the window member, and that extends flatly toward the second surface of the window member; and a rounded surface that connects a second side of the first inner surface and a second side of the second inner surface, and that is concave toward the second surface of the window member.

10. The display device of claim 9, wherein the first inner surface and the second inner surface are inclined such that the width of the one of the first and second grooves becomes narrower toward the second surface.

11. The display device of claim 9, wherein the rounded surface has an elliptical shape that is partially open toward the first surface of the window member in a cross-sectional view.

12. The display device of claim 11, wherein at least one of a length of a major axis of the elliptical shape or a length of a minor axis of the elliptical shape is equal to a width between the first side of the first inner surface and the first side of the second inner surface.

13. The display device of claim 8, wherein the one of the first and second grooves is partially defined by a pair of protrusions protruding toward an inside thereof so that the width of the one of the grooves decreases in a cross-sectional view.

14. The display device of claim 8, wherein a difference of respective refractive indexes of the window member and the filling member is about 0.0001 or less.

15. The display device of claim 8, wherein the second surface of the window member is directly exposed to outside of the display device.

* * * * *